US012666743B2

(12) United States Patent
Gocho

(10) Patent No.: US 12,666,743 B2
(45) Date of Patent: Jun. 23, 2026

(54) SEMICONDUCTOR APPARATUS, IMAGING APPARATUS, AND MANUFACTURING METHOD OF SEMICONDUCTOR APPARATUS

(71) Applicant: SONY SEMICONDUCTOR SOLUTIONS CORPORATION, Kanagawa (JP)

(72) Inventor: Tetsuo Gocho, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 503 days.

(21) Appl. No.: 18/004,265

(22) PCT Filed: Apr. 27, 2021

(86) PCT No.: PCT/JP2021/016718
§ 371 (c)(1),
(2) Date: Jan. 4, 2023

(87) PCT Pub. No.: WO2022/014118
PCT Pub. Date: Jan. 20, 2022

(65) Prior Publication Data
US 2023/0317759 A1 Oct. 5, 2023

(30) Foreign Application Priority Data
Jul. 15, 2020 (JP) ................................. 2020-121245

(51) Int. Cl.
*H10W 20/00* (2026.01)
*H10F 39/00* (2025.01)
(Continued)

(52) U.S. Cl.
CPC .......... *H10F 39/811* (2025.01); *H10F 39/011* (2025.01)

(58) Field of Classification Search
CPC ................. H10F 39/811; H10F 39/809; H01L 2221/1063; H01L 21/7682;
(Continued)

(56) References Cited

U.S. PATENT DOCUMENTS

| 7,402,515 B2 * | 7/2008 | Arana ............... | H01L 21/76898 257/E21.597 |
| 8,647,920 B2 * | 2/2014 | Tezcan .............. | H01L 21/76898 257/737 |

(Continued)

FOREIGN PATENT DOCUMENTS

| JP | 2013-115382 A | 6/2013 |
| JP | 2014-512692 A | 5/2014 |

(Continued)

OTHER PUBLICATIONS

International Search Report and Written Opinion of PCT Application No. PCT/JP2021/016718, issued on Jul. 6, 2021, 09 pages of ISRWO.

*Primary Examiner* — Mohsen Ahmadi
(74) *Attorney, Agent, or Firm* — CHIP LAW GROUP

(57) ABSTRACT

Parasitic capacitance in a through-silicon via (TSV) is reduced. A semiconductor apparatus includes a given layer. A via vertically penetrates the given layer. A conductor is in contact with an upper surface side material and a lower surface side material of the vertically penetrated layer. The conductor forms, between the conductor and an inside of the via, a cavity portion that vertically penetrates the layer without being in contact with the inside of the via. At least either the upper surface side material or the lower surface side material of the layer is a conductive material, and at least part of the conductive material includes an opening portion for the cavity portion. This opening portion is used to supply an etchant during etching.

5 Claims, 36 Drawing Sheets

(51) Int. Cl.

| | | |
|---|---|---|
| *H10F 39/12* | (2025.01) | |
| *H10W 20/20* | (2026.01) | |
| *H10W 20/40* | (2026.01) | |
| *H10W 20/46* | (2026.01) | |
| *H10W 20/47* | (2026.01) | |
| *H10W 20/48* | (2026.01) | |

(58) Field of Classification Search
CPC ............. H01L 21/76898; H01L 23/481; H01L 23/5222; H01L 23/53295; H10W 20/023; H10W 20/46
See application file for complete search history.

(56) References Cited

U.S. PATENT DOCUMENTS

| | | | |
|---|---|---|---|
| 9,059,262 B2 * | 6/2015 | Liu ................... | H01L 21/76898 |
| 2009/0189256 A1 * | 7/2009 | Yoshimura ............. | H10P 72/74 |
| | | | 257/E21.597 |
| 2012/0292782 A1 | 11/2012 | Lee et al. | |
| 2012/0299066 A1 * | 11/2012 | Kato ................... | H10F 39/024 |
| | | | 257/E31.124 |
| 2013/0115769 A1 * | 5/2013 | Yu ........................ | H01L 23/481 |
| | | | 257/E21.597 |
| 2014/0264921 A1 * | 9/2014 | Gao ...................... | H01L 23/481 |
| | | | 257/774 |
| 2020/0357723 A1 * | 11/2020 | Shohji .............. | H01L 21/76898 |
| 2022/0013629 A1 * | 1/2022 | Chou ............... | H01L 21/76229 |

FOREIGN PATENT DOCUMENTS

| | | | |
|---|---|---|---|
| JP | 2015-511765 A | 4/2015 | |
| JP | 2016-032087 A | 3/2016 | |
| JP | 2019-075515 A | 5/2019 | |

* cited by examiner 367          370

312

311

310

SEMICONDUCTOR APPARATUS, IMAGING APPARATUS, AND MANUFACTURING METHOD OF SEMICONDUCTOR APPARATUS

CROSS REFERENCE TO RELATED APPLICATIONS

This application is a U.S. National Phase of International Patent Application No. PCT/JP2021/016718 filed on Apr. 27, 2021, which claims priority benefit of Japanese Patent Application No. JP 2020-121245 filed in the Japan Patent Office on Jul. 15, 2020. Each of the above-referenced applications is hereby incorporated herein by reference in its entirety.

TECHNICAL FIELD

The present technology relates to a semiconductor apparatus. More specifically, the present technology relates to a semiconductor apparatus having a through electrode and a manufacturing method of the same.

BACKGROUND ART

There is known a through-silicon via (TSV) technology that extracts electrodes from a back side of a semiconductor substrate as a semiconductor apparatus downsizing technology. In this TSV, increase in speed may be hindered by presence of parasitic capacitance with a semiconductor substrate on a side surface of the TSV that penetrates the semiconductor substrate. Meanwhile, a device having an isolation recess portion formed in a TSV's liner isolation layer has been proposed for the purpose of mitigating the impact caused by the stress of the TSV (refer, for example, to PTL 1).

CITATION LIST

Patent Literature

[PTL1]
Japanese Translations of PCT for Patent No. 2015-511765

SUMMARY

Technical Problem

In the above technology of the related art, an air gap is partially formed by an isolation recess portion being provided. However, this isolation recess portion is provided to mitigate the impact of stress caused by the TSV and is not sufficient to reduce parasitic capacitance.

The present technology has been devised in light of the foregoing, and it is an object thereof to reduce the parasitic capacitance in the TSV.

Solution to Problem

The present technology has been devised to solve the above problem, and a first aspect thereof is a semiconductor apparatus that includes a via that vertically penetrates a given layer, an upper surface side material and a lower surface side material of the layer, and a conductor that is in contact with the upper surface side material and the lower surface side material of the layer and that forms, between the conductor and an inside of the via, a cavity portion that vertically penetrates the layer. This has an action of forming the cavity portion around the conductor and reducing parasitic capacitance.

Also, in this first aspect, at least either the upper surface side material or the lower surface side material of the layer may be a conductive material, and at least part of the conductive material may include an opening portion for the cavity portion. This has an action of supplying an etchant from the opening portion when the cavity portion is formed.

Further, in this first aspect, the layer may be a semiconductor substrate or an insulating film.

Further, in this first aspect, an insulating side wall formed inside the via may also be included. This has an action of ensuring electrical insulation even in a case where the layer is a semiconductor substrate.

Further, in this first aspect, the conductor may include an insulating material thereinside.

Further, in this first aspect, the conductor may form wiring.

Further, in this first aspect, a surrounding trench that vertically penetrates the layer at a circumference of the via may further be included.

Further, a second aspect of the present technology is an imaging apparatus having a stacked structure that includes multiple layers, and the imaging apparatus includes a via that vertically penetrates a given layer of the multiple layers, an upper surface side material and a lower surface side material of the layer, and a conductor that is in contact with the upper surface side material and the lower surface side material of the layer and that forms, between the conductor and an inside of the via, a cavity portion that vertically penetrates the layer. This has an action of forming the cavity portion around the conductor and reducing parasitic capacitance.

Further, in this second aspect, at least either the upper surface side material or the lower surface side material of the layer may be a conductive material, and at least part of the conductive material may include an opening portion for the cavity portion. This has an action of supplying an etchant from the opening portion when the cavity portion is formed.

Further, in this second aspect, the conductive material may be arranged on a surface opposed to an incident light side or on the same surface as the incident light side.

Further, a third aspect of the present technology is a semiconductor apparatus manufacturing method that includes a step of forming a via that vertically penetrates a given layer, a step of forming, inside the via, an etching target material having an etching rate different from that of the layer, a step of forming a conductor inside the etching target material, and a step of etching the etching target material with the conductor in contact with an upper surface side material and a lower surface side material of the layer. This has an action of forming the cavity portion around the conductor by etching, and reducing parasitic capacitance.

Further, in this third aspect, at least either the upper surface side material or the lower surface side material of the layer may be a conductive material, and a step of shaping the conductive material such that the etching target material is exposed at least at part of the conductive material may further be included. This has an action of forming a cavity portion by etching the exposed etching target material.

DESCRIPTION OF EMBODIMENTS

A description will be given below of modes for carrying out the present technology (hereinafter referred to as embodiments). The description will be given in the following order.

1. First embodiment (example of application to an opening on a wafer back surface)
2. Second embodiment (example of application to a stacked CIS back surface)
3. Third embodiment (example of application to a stacked CIS front surface)
4. Fourth embodiment (example of application to a wiring formation process)
5. Fifth embodiment (example of application to a via)
6. Sixth embodiment (first example of application to a surrounding portion)
7. Seventh embodiment (second example of application to a surrounding portion)

1. First Embodiment

[Structure of the Semiconductor Apparatus]

Figures 1A, 1B:
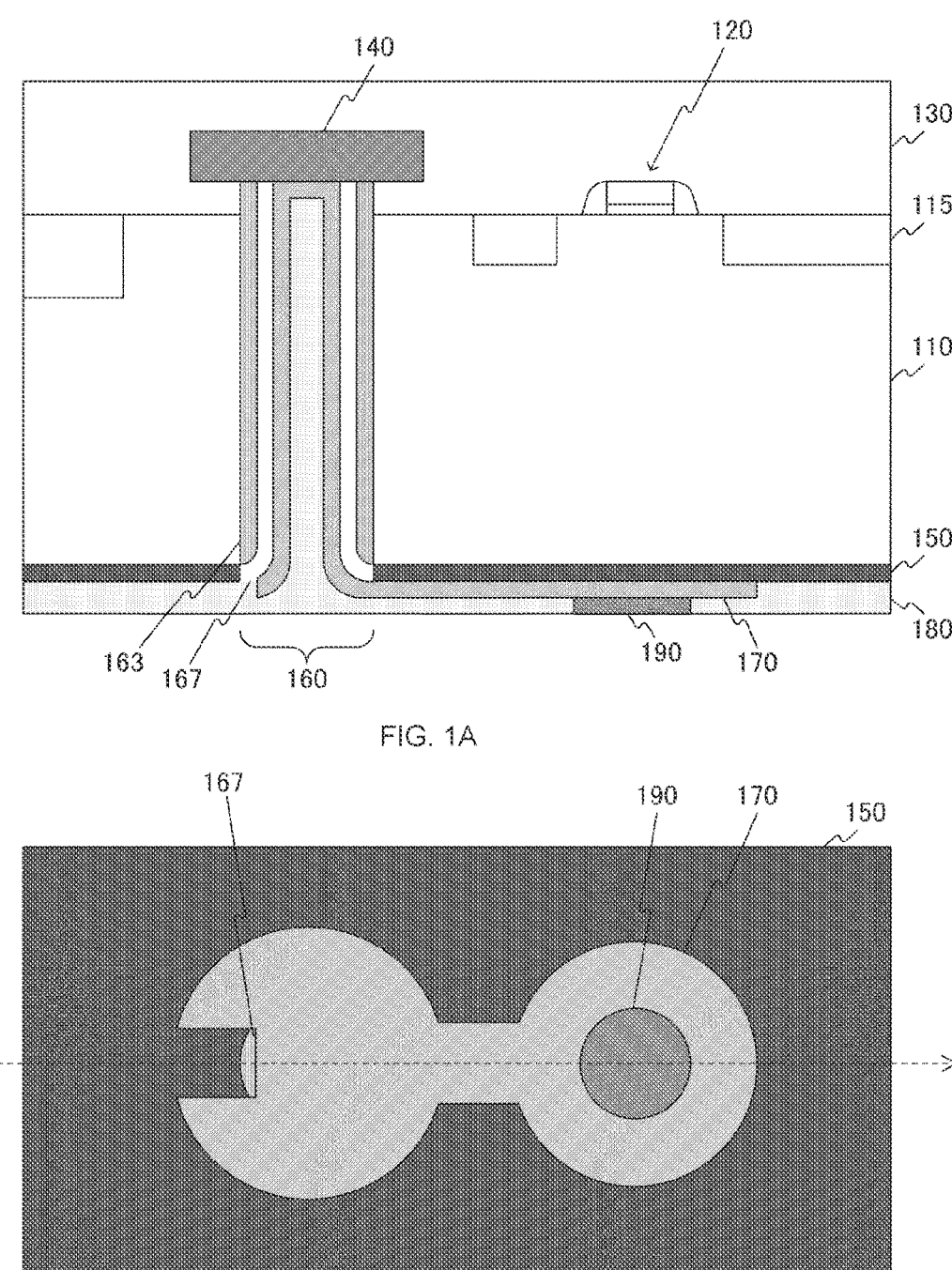
FIGS. 1A and 1B depict diagrams illustrating an example of a structure of a semiconductor apparatus in a first embodiment of the present technology.

FIGS. 1A and 1B depict diagrams illustrating an example of a structure of a semiconductor apparatus in a first embodiment of the present technology. In FIGS. 1A and 1B, FIG. 1A illustrates a sectional view, and FIG. 1B illustrates a back view.

In this semiconductor apparatus, a via (TSV) 160 that vertically penetrates a silicon (Si) substrate 110 is provided. It should be noted that the silicon substrate 110 is an example of a given layer recited in claims.

A transistor 120 is formed on the silicon substrate 110. Elements on the silicon substrate 110 are isolated by STI (Shallow Trench Isolation) 115.

An interlayer insulating film 130 is formed on an upper surface side of the silicon substrate 110. Wiring 140 is formed in the interlayer insulating film 130. The wiring 140 includes, for example, aluminum (Al) or copper (Cu) as a material. It should be noted that the wiring 140 is an example of an upper surface side material of a layer recited in the claims.

An insulating film 150 is formed on a lower surface side of the silicon substrate 110. The via 160 that penetrates the silicon substrate 110 from the insulating film 150 and stretches to a front of the wiring 140 is formed.

A side wall 163 is formed inside the via 160. An insulating material is used for the side wall 163 to ensure electrical insulation from the silicon substrate 110. It should be noted that the side wall 163 is an example of a side wall recited in the claims.

The wiring 170 is formed further inside the via 160. The wiring 170 is formed in a manner of being pulled out to an outside of the insulating film 150. The wiring 170 includes, for example, aluminum or copper as a material. Although the material inside the via 160 and the material outside the insulating film 150 are combined and formed as the wiring 170 in this example, these may be formed as different materials. That is, the wiring 170 is an example of a lower surface side material of a layer and a conductor recited in the claims.

A cavity portion 167 is formed between the wiring 170 and the side wall 163. The cavity portion 167 is formed by etching as will be described later. Accordingly, the wiring 170 outside the insulating film 150 includes an opening portion for supplying the etchant as illustrated in FIG. 1B.

[Manufacturing method of semiconductor apparatus]

FIGS. 2A, 2B, 3A, 3B, 4A, 4B, 5A, 5B, 6A, and 6B are diagrams illustrating examples of procedures of a semiconductor apparatus manufacturing method in the first embodiment of the present technology. In respective FIGS. 2A, 2B, 3A, 3B, 4A, 4B, 5A, 5B, 6A, and 6B, FIGS. 2A, 3A, 4A, 5A, and 6A illustrate sectional views, and FIGS. 2B, 3B, 4B, 5B, and 6B illustrate back views.

An insulating layer 180 is formed under the wiring 170. The insulating layer 180 is also formed inside the wiring 170 of the via 160. In the insulating layer 180, an opening is provided at a position corresponding to that of the wiring 170, and a bump 190 is formed in the opening. The bump 190 is a pad that includes, for example, copper (Cu) as a material. It should be noted that the insulating layer 180 is not illustrated in the back view.

Figure 2A:
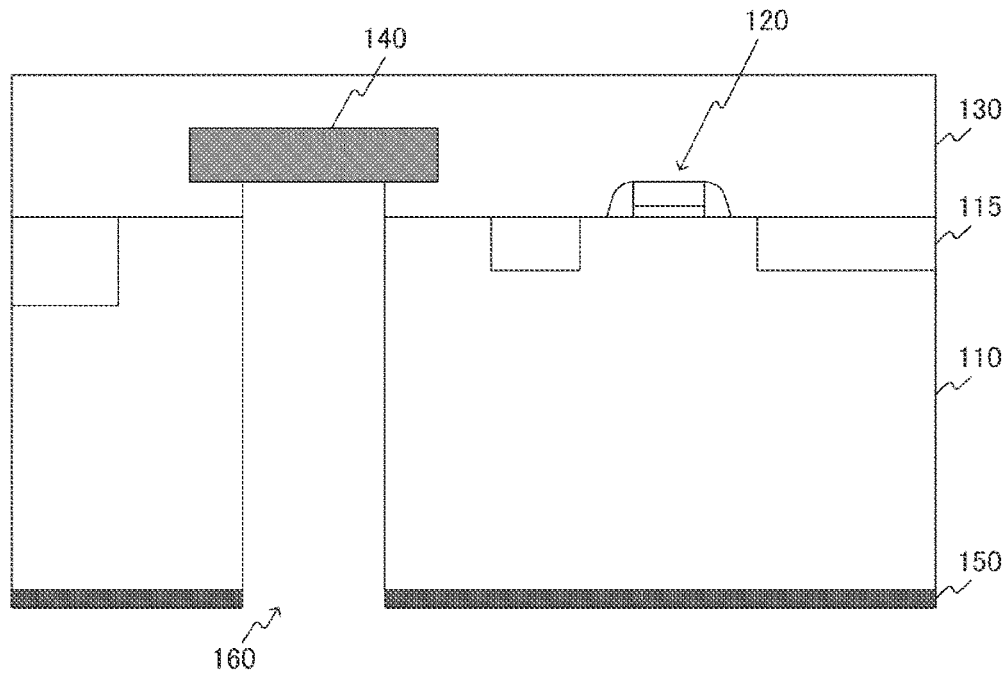
FIGS. 2A and 2B depict first diagrams illustrating an example of a procedure of a semiconductor apparatus manufacturing method in the first embodiment of the present technology.
Figure 2B:
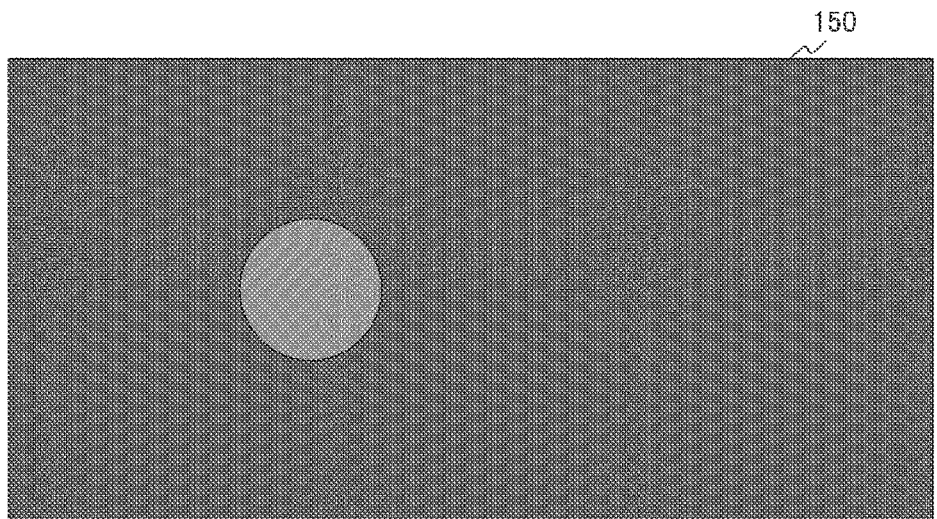

First, as illustrated in FIGS. 2A and 2B, the transistor 120 is formed on the silicon substrate 110. Further, the interlayer insulating film 130 is formed on the upper surface side of the silicon substrate 110. The wiring 140 is formed in the interlayer insulating film 130 (BEOL: Back End Of Line).

Further, the insulating film 150 is formed on the lower surface side of the silicon substrate 110. Further, an opening of the via 160 is formed in a region that vertically penetrates the silicon substrate 110 from the insulating film 150 and stretches to the front of the wiring 140.

Figure 3A:
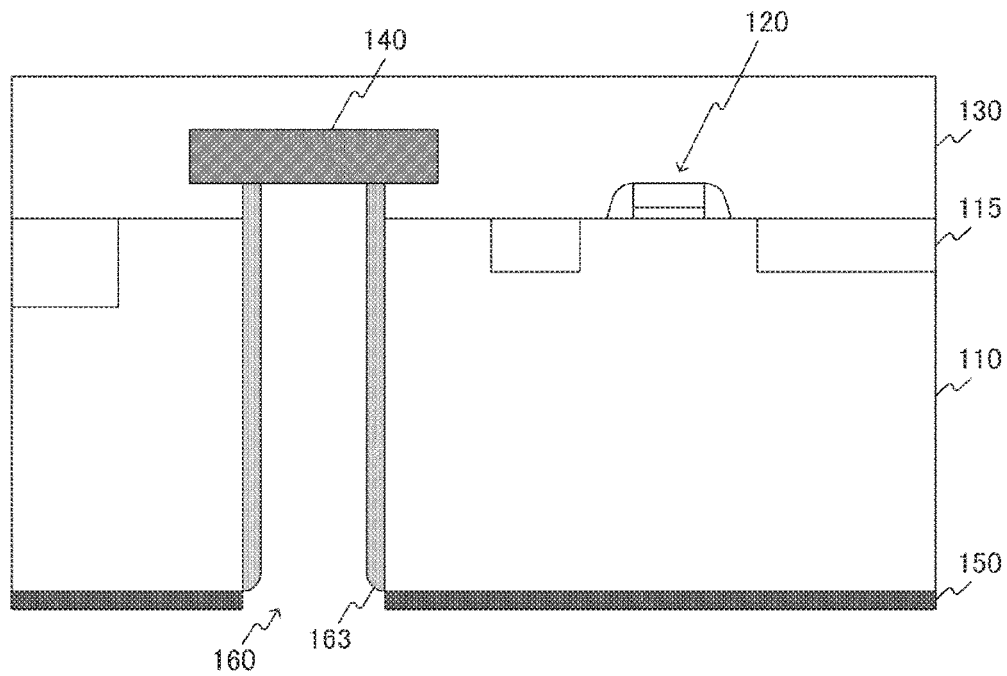
FIGS. 3A and 3B depict second diagrams illustrating an example of a procedure of the semiconductor apparatus manufacturing method in the first embodiment of the present technology.
Figure 3B:
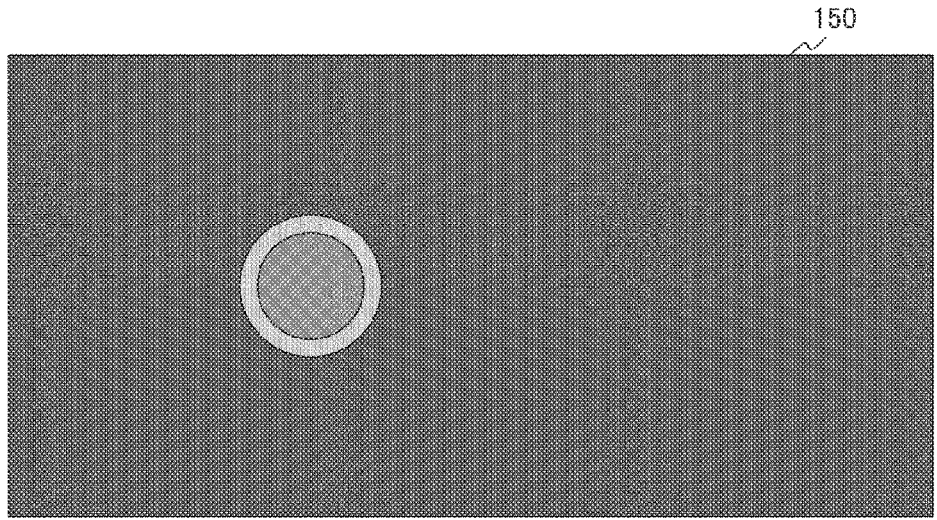

Next, as illustrated in FIGS. 3A and 3B, the side wall 163 is formed inside the via 160. The side wall 163 is formed by CVD (Chemical Vapor Deposition) and etchback.

Figure 4A:
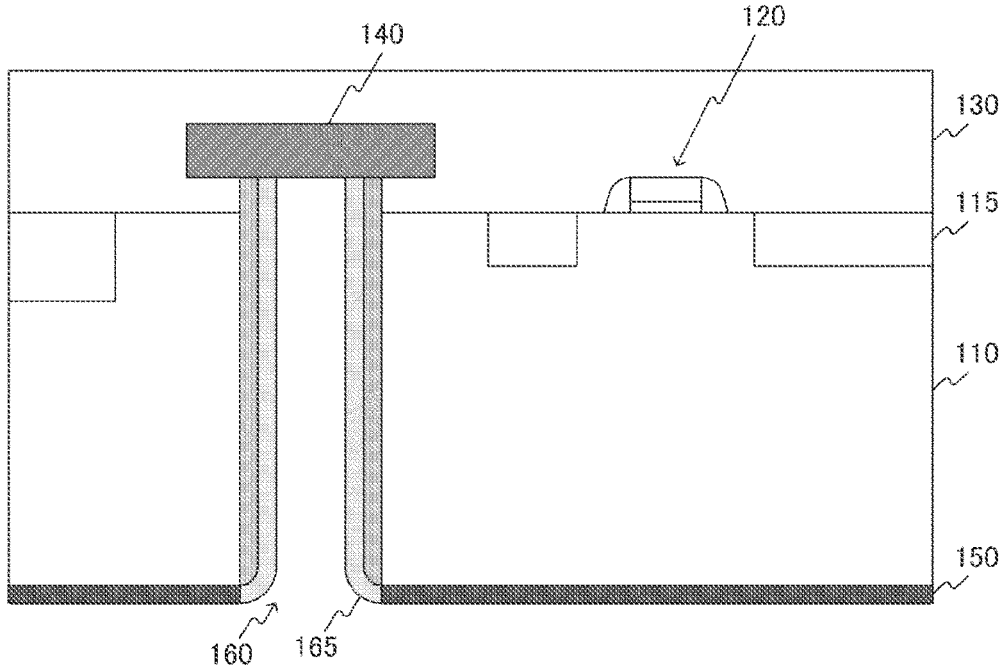
FIGS. 4A and 4B depict third diagrams illustrating an example of a procedure of the semiconductor apparatus manufacturing method in the first embodiment of the present technology.
Figure 4B:
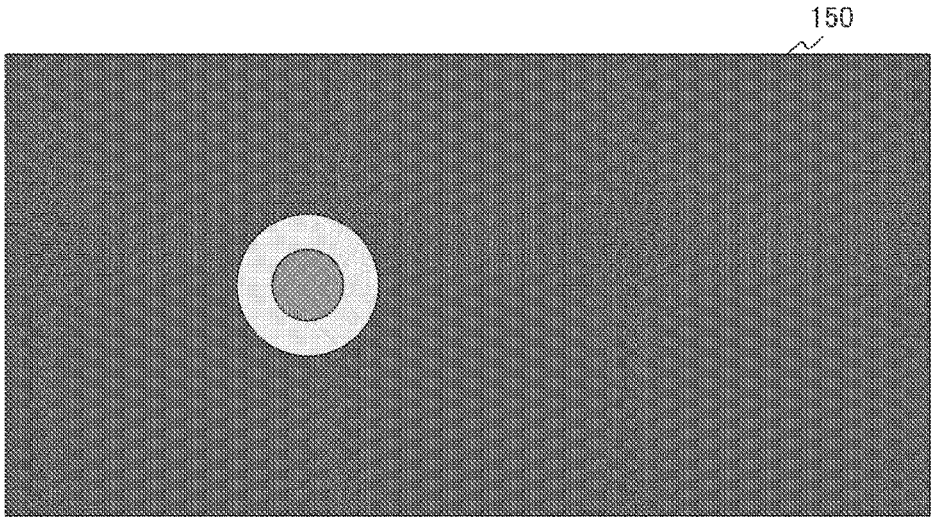

Then, as illustrated in FIGS. 4A and 4B, a side wall 165 is formed further inside the side wall 163. The side wall 165 is also formed by CVD and etchback as with the side wall 163. It should be noted, however, that a material having a higher etching rate than those of the side wall 163 and the insulating film 150 are used for this CVD film. Specifically, a BSG (Boron Silica Glass)- or BPSG (Boron Phosphorus Silica Glass)-based film or a resin-based material is used. It should be noted that the side wall 165 is an example of an etching target material recited in the claims.

In a case where a resin-based material is used for the side wall 165, for example, a material that includes a base resin having carboxylic acid, an inorganic filler, epoxy resin, and a pigment may be used. Also, cyclized polyisoprene or cyclized polybutadiene obtained by cyclizing polyisoprene or polybutadiene may be used for the base resin. Moreover, a novolac resin and a 1,2-naphthoquinonediazide sulfonic acid ester-based compound may be used. In addition, polycinnamic acid vinyl, epoxy resin, polysiloxane, polyamide-imide, polyoxazole, polyacrylamide, cresol novolac, polyisoprene, polyvinyl alcohol, and the like may also each be used.

In this case, examples of resin solvents that can be used are diethylene glycol monoethyl ether acetate, diethylene glycol monobutyl ether acetate, diethylene glycol monoethyl ether acetate, diethylene glycol monobutyl ether acetate, tetramethylammonium hydroxide, tetramethylammonium hydroxide, tetrabutylammonium hydroxide, and the like. Also, ashing by oxygen plasma, ashing by ozone, and the like are possible as resin etching methods other than solvents.

Figure 5A:
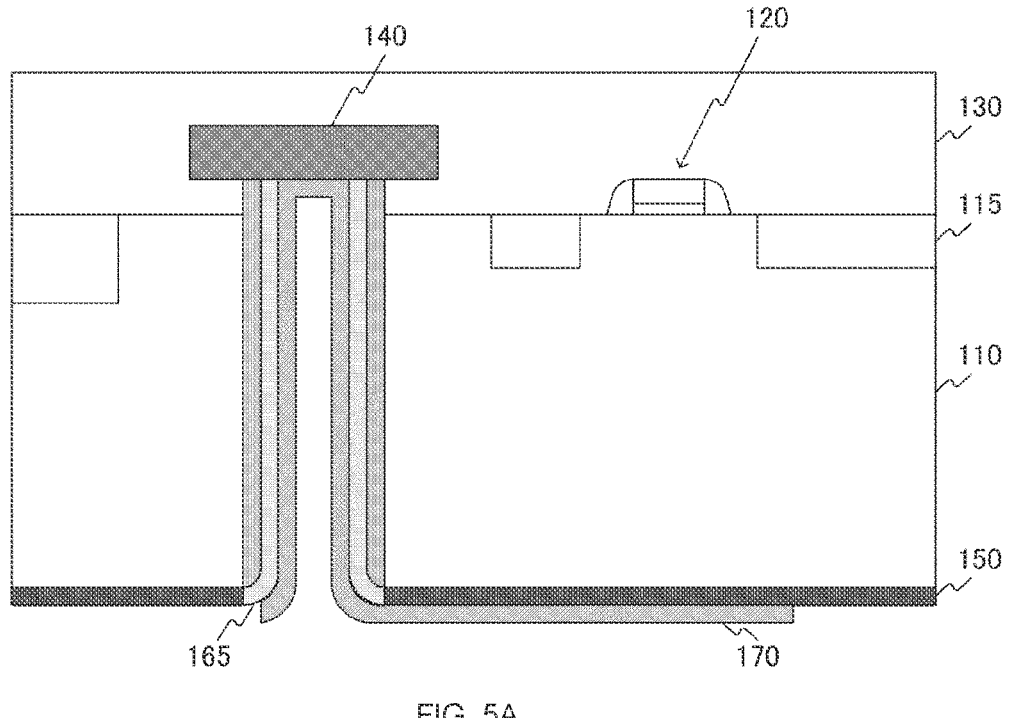
FIGS. 5A and 5B depict fourth diagrams illustrating an example of a procedure of the semiconductor apparatus manufacturing method in the first embodiment of the present technology.
Figure 5B:
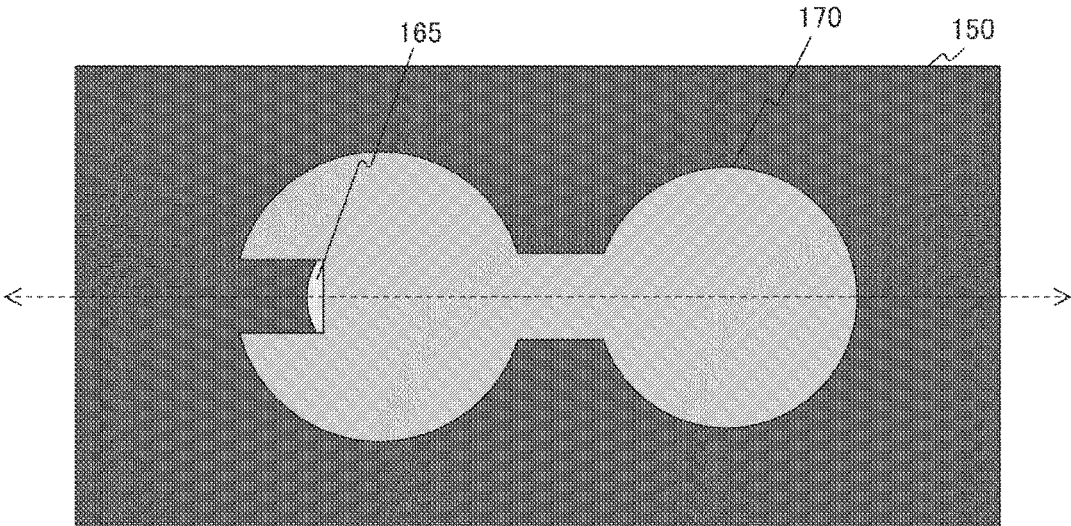

Next, as illustrated in FIGS. 5A and 5B, the wiring 170 is formed further inside the side wall 165. The wiring 170 is formed in a manner of being pulled out to an outside of the insulating film 150. That is, the wiring 170 inside the side wall 165 is maintained in contact with the wiring 170 outside the insulating film 150 and the wiring 140 of the interlayer insulating film 130. Also, an opening portion is provided in the wiring 170 outside the insulating film 150, and part of the side wall 165 is exposed.

Figure 6A:
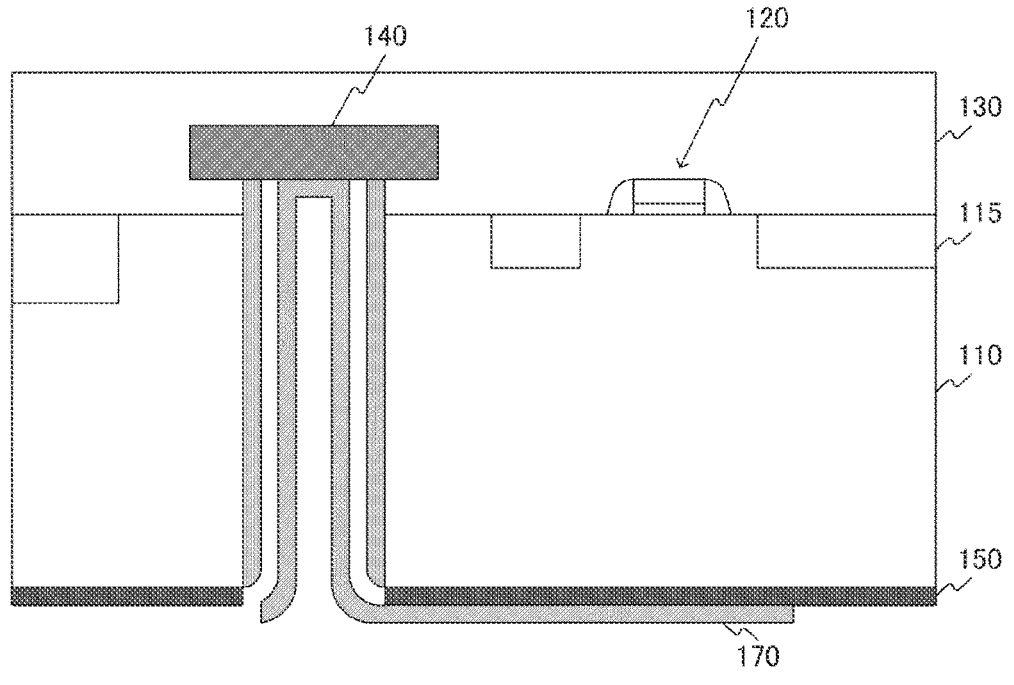
FIGS. 6A and 6B depict fifth diagrams illustrating an example of a procedure of the semiconductor apparatus manufacturing method in the first embodiment of the present technology.
Figure 6B:
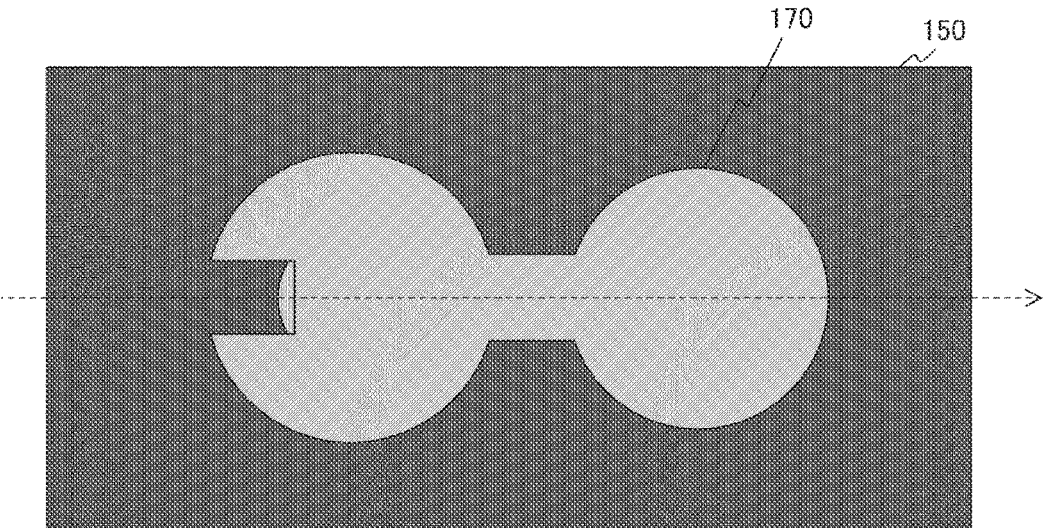

Further, in this state, as illustrated in FIGS. 6A and 6B, the side wall 165 is removed by photolithography and wet etching, forming the cavity portion 167 between the wiring 170 and the side wall 163. At this time, the etchant used for wet etching is supplied from the opening portion of the wiring 170 outside the insulating film 150.

Thereafter, the insulating layer 180 is formed under the wiring 170, an opening is provided at the position corresponding to that of the wiring 170, and the bump 190 is formed in that opening. This forms the above semiconductor apparatus structure.

[Modification example of shape of wiring] FIGS. 7A, 7B, 7C, 8A, 8B, 8C, 9A, 9B, 9C, and 9D are diagrams illustrating an example of a shape of the wiring 170 outside the insulating film 150 of the semiconductor apparatus in the first embodiment of the present technology.

Figure 7A:
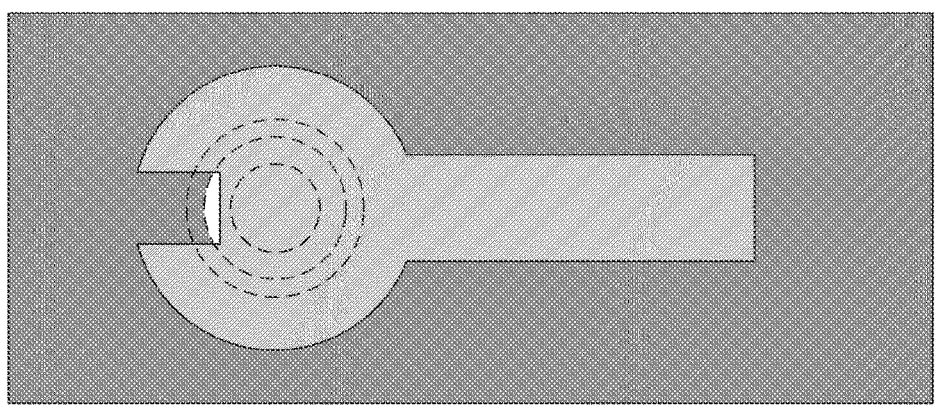
FIGS. 7A, 7B, and 7C depict first diagrams illustrating an example of a shape of wiring 170 outside an insulating film 150 of the semiconductor apparatus in the first embodiment of the present technology.
Figure 7B:
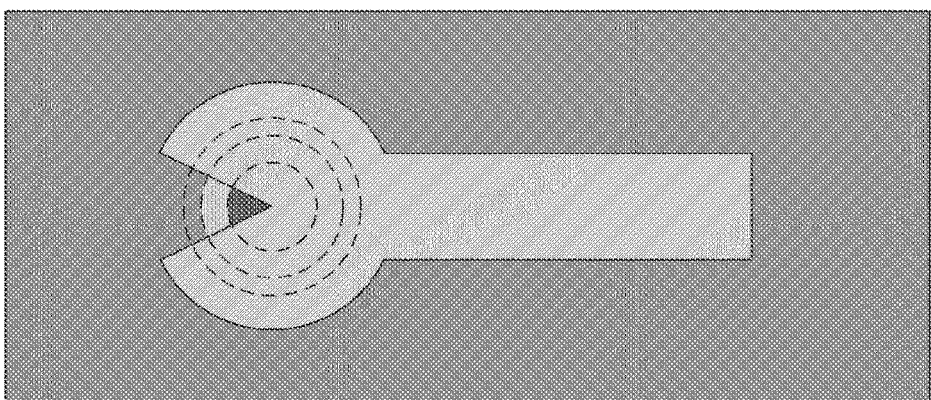
Figure 7C:
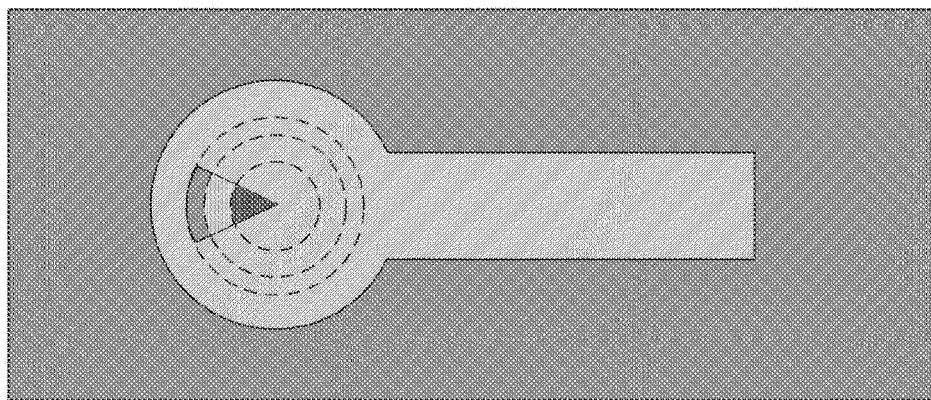

In FIGS. 7A, 7B, and 7C, FIG. 7A is an example of a shape similar to that of the above first embodiment, in which an opening portion is formed by a rectangular notch being added in a circular shape.

In FIGS. 7A, 7B, and 7C, FIG. 7B is an example of a shape in which an opening portion is formed by a fan-shaped notch being added in a circular shape.

In FIGS. 7A, 7B, and 7C, FIG. 7C is an example of a shape in which an opening portion is partially formed in a circular shape. In this case, a contact area between the wiring 170 and the insulating film 150 increases as compared to the above examples, reinforcing strength for fastening the wiring 170.

Figure 8A:
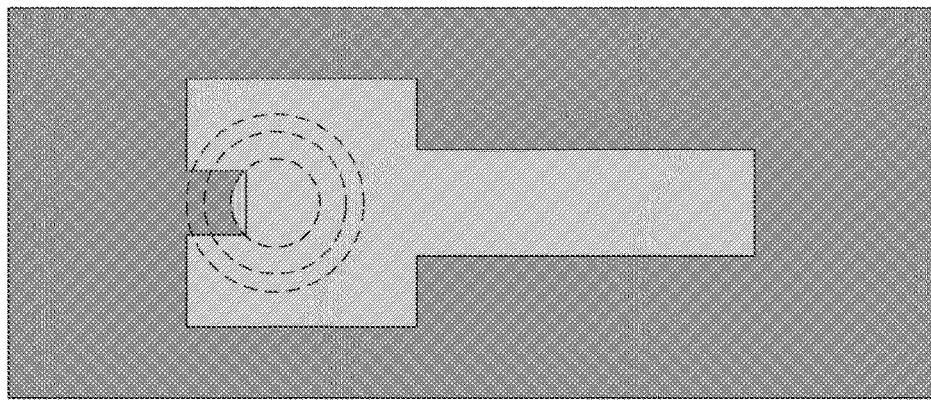
FIGS. 8A, 8B, and 8C depict second diagrams illustrating an example of a shape of the wiring 170 outside the insulating film 150 of the semiconductor apparatus in the first embodiment of the present technology.
Figure 8B:
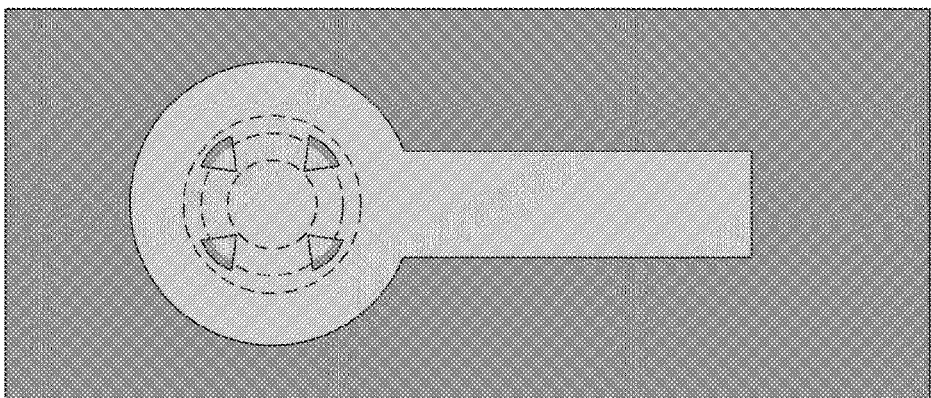
Figure 8C:
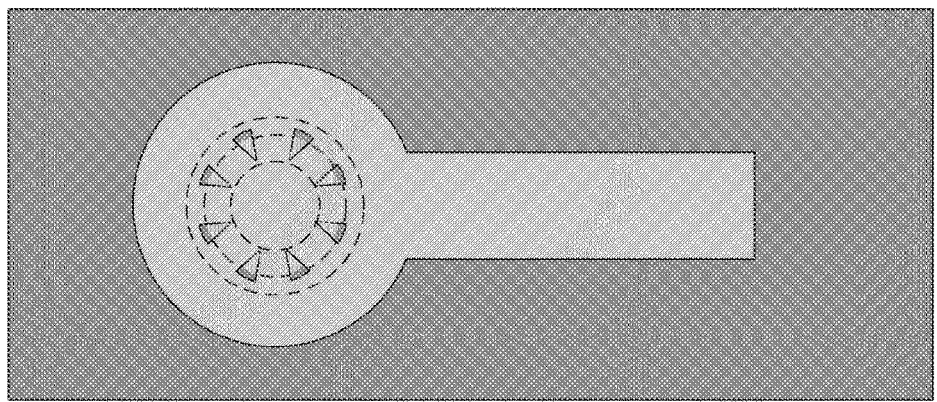
Figure 9A:
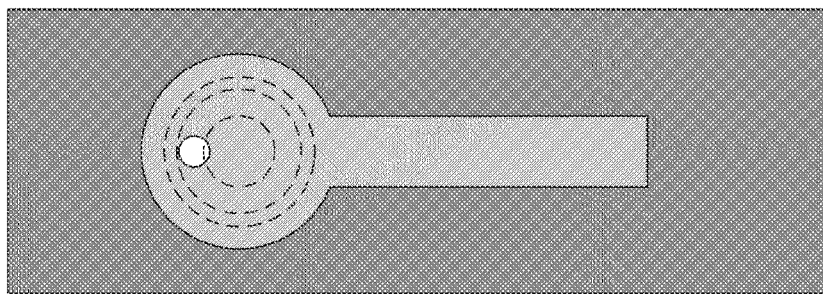
FIGS. 9A, 9B, 9C, and 9D depict second diagrams illustrating an example of a shape of the wiring 170 outside the insulating film 150 of the semiconductor apparatus in the first embodiment of the present technology.
Figure 9B:
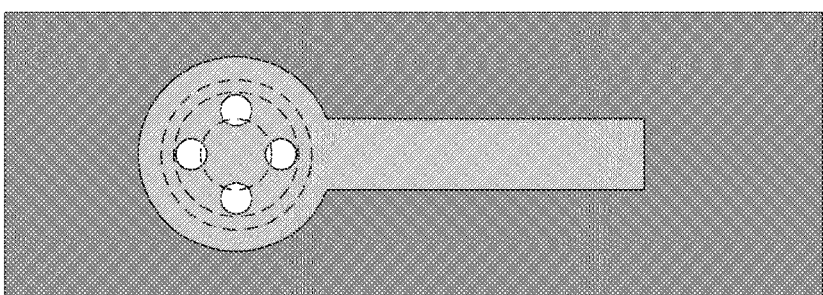
Figure 9C:
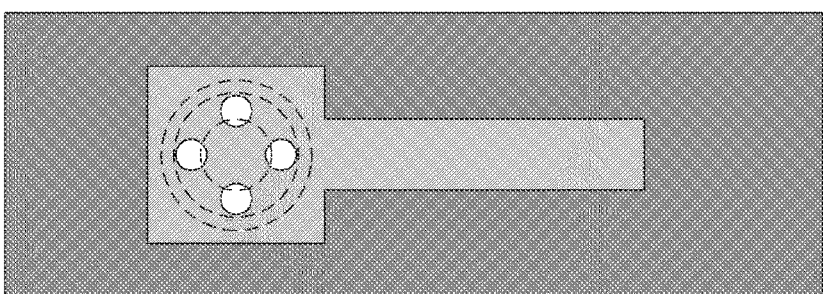
Figure 9D:
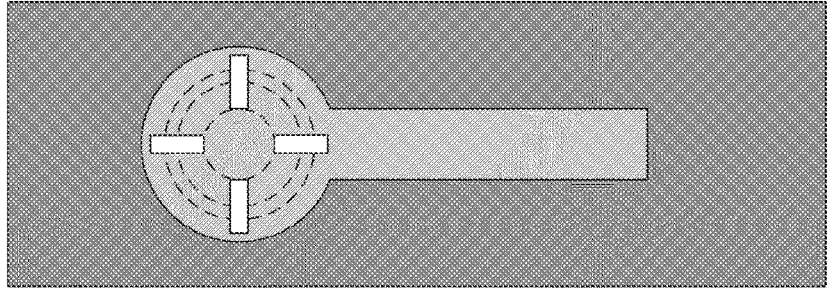

In FIGS. 8A, 8B, and 8C, FIG. 8A is an example of a shape in which an opening portion is formed by a rectangular notch being added in a rectangular shape.

In FIGS. 8A, 8B, and 8C, FIGS. 8B and 8C are examples of shapes in which multiple opening portions are formed in a circular shape. In this case, as the number of opening portions increases, it becomes easier to perform etching for forming the cavity portion 167.

In FIGS. 9A, 9B, 9C, and 9D, FIG. 9A is an example of a shape in which an etching hole is formed in a circular shape.

In FIGS. 9A, 9B, 9C, and 9D, FIG. 9B is an example of a shape in which multiple etching holes are formed in a circular shape. In FIGS. 9A, 9B, 9C, and 9D, FIG. 9C is an example of a shape in which multiple etching holes are formed in a rectangular shape. In this case, as the number of etching holes increases, it becomes easier to perform etching for forming the cavity portion 167.

In FIGS. 9A, 9B, 9C, and 9D, FIG. 9D is an example of a shape in which multiple rectangular etching openings are formed in a circular shape. In this case, etching becomes easier than in the example of h even in the case of misalignment.

Thus, in the first embodiment of the present technology, the cavity portion 167 that vertically penetrates the silicon substrate 110 around the wiring 170 inside the via 160 is formed by removal of, by etching, the side wall 165 that includes a material having a high wet etching rate. This decreases a dielectric constant of a side surface of the via 160 and reduces parasitic capacitance, enabling high-speed operation of the semiconductor apparatus.

Further, in general, an element arrangement prohibition region referred to as a KOZ (Keep-Out-Zone) is provided around the TSV to avoid an impact of stress caused by TSV formation. In this first embodiment, the use of the cavity portion 167 as a TSV side surface film reduces transfer of TSV stress, thereby reducing the KOZ and allowing downsizing of a chip.

2. Second Embodiment

[Structure of Semiconductor Apparatus]

Figure 10:
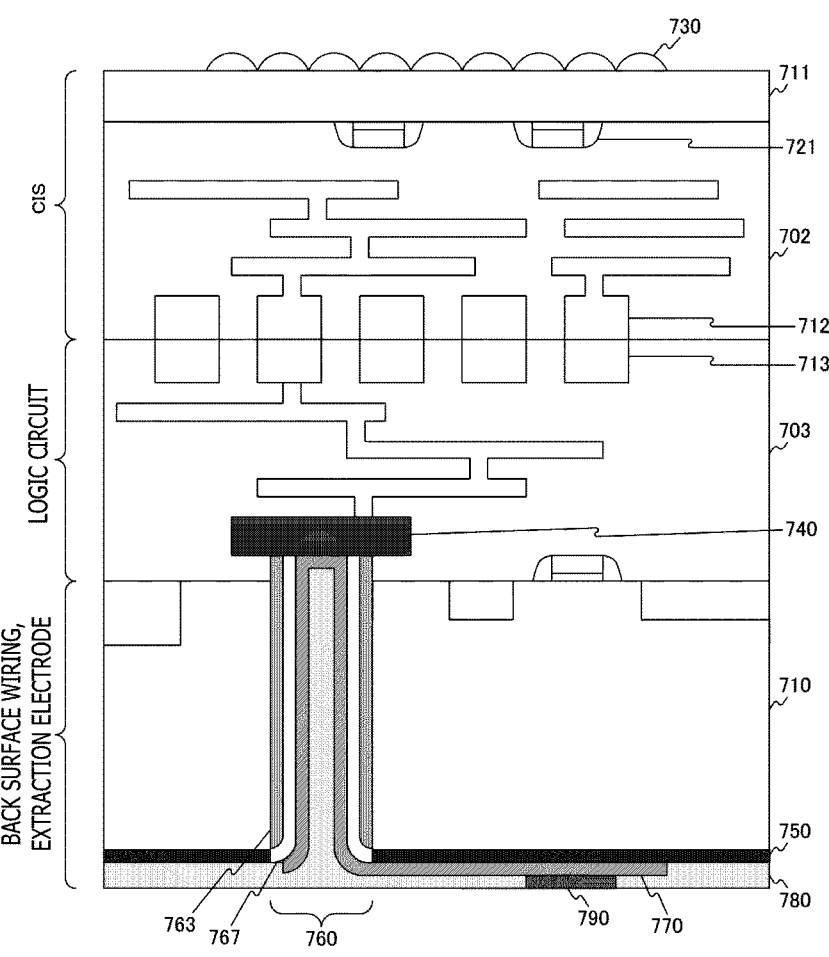
FIG. 10 is a diagram illustrating an example of a structure of a semiconductor apparatus in a second embodiment of the present technology.

FIG. 10 is a diagram illustrating an example of a structure of a semiconductor apparatus in a second embodiment of the present technology.

The semiconductor apparatus in this second embodiment is included in an imaging apparatus having a stacked structure. This imaging apparatus includes a CIS (CMOS Image Sensor) layer, a logic circuit layer, and a back surface wiring and extraction electrode layer.

In this second embodiment, an opening of a via 760 that vertically penetrates a silicon substrate 710 from an insulating film 750 and stretches to the front of wiring 740 is formed in the back surface wiring and extraction electrode layer. Further, a cavity portion 767 is formed between a side wall 763 of the via 760 and wiring 770. An insulating layer 780 is formed under the wiring 770, an opening is provided at the position corresponding to that of the wiring 770, and a bump 790 is formed in the opening. It should be noted that the silicon substrate 710 is an example of a given layer recited in the claims.

The wiring 740 is formed in an insulating film 703 of the logic circuit. The wiring 740 is further connected to other wiring and connects to a bump 713 on an upper surface of the logic circuit. The bump 713 on the upper surface of the logic circuit is electrically connected to a bump 712 on a lower surface of the CIS (e.g., Cu—Cu connection).

The bump 712 on the lower surface of the CIS is further connected to wiring formed in an insulating film 702 of the CIS. The CIS includes not only color filters 730 on an upper surface of a silicon substrate 711 but also pixel transistors 721 on a lower surface thereof.

The structure of the back surface wiring and extraction electrode layer in this second embodiment is similar to that of the above first embodiment. Moreover, the manufacturing method thereof is similar to that of the first embodiment, and a detailed description will be omitted.

As described above, in the second embodiment of the present technology, it is possible to reduce parasitic capacitance and enable high-speed operation of the imaging apparatus by forming, on the back surface of the CMOS image sensor, the cavity portion 767 that vertically penetrates the silicon substrate 710 around the wiring 770 inside the via 760.

3. Third Embodiment

While an example in which the TSV is provided on the back surface of the CMOS image sensor has been described in the above second embodiment, a description will be given, in this third embodiment, of an example in which the TSV is provided on a front surface of the CMOS image sensor.

[Structure of Semiconductor Apparatus]

Figure 11:
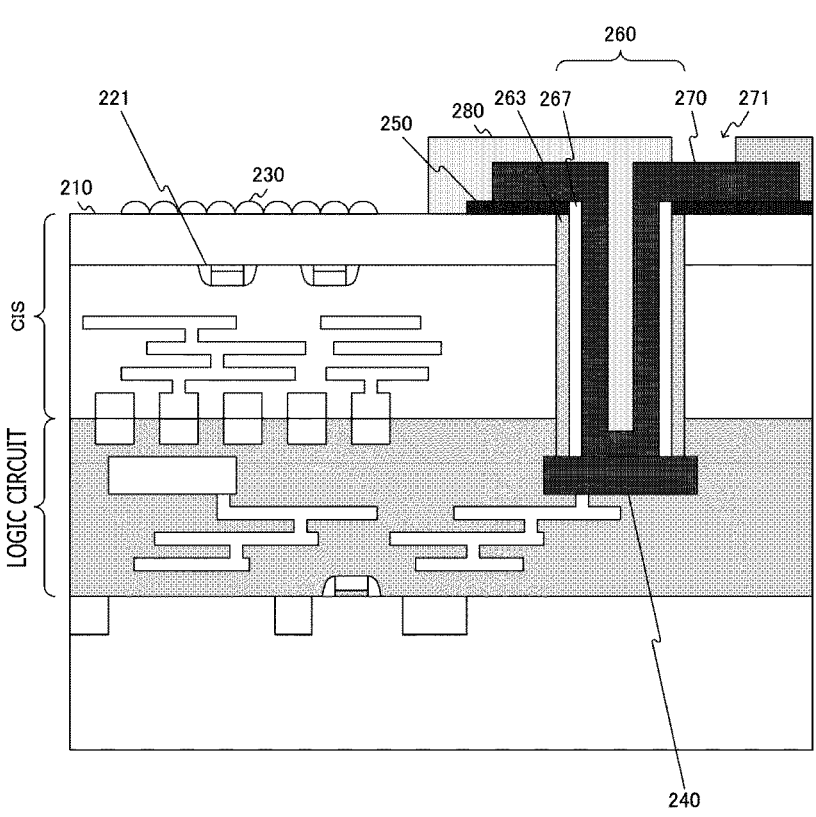
FIG. 11 is a diagram illustrating an example of a structure of a semiconductor apparatus in a third embodiment of the present technology.

FIG. 11 is a diagram illustrating an example of a structure of a semiconductor apparatus in the third embodiment of the present technology.

In this third embodiment, an opening of a via 260 that vertically penetrates a silicon substrate 210 from an insulating film 250 and stretches to the front of wiring 240 of the logic circuit is formed in the imaging apparatus having a stacked structure. Further, a cavity portion 267 is formed between a side wall 263 of the via 260 and wiring 270. An insulating layer 280 is formed on top of the wiring 270, and an opening for providing a pad is provided at the position corresponding to that of the wiring 270. It should be noted that the silicon substrate 210 is an example of the given layer recited in the claims.

The wiring 240 is connected to other wiring of the logic circuit and connects to a bump on an upper surface of the logic circuit. The bump on the upper surface of the logic circuit is electrically connected to the bump on the lower surface of the CIS. The CIS includes not only color filters 230 on the upper surface of the silicon substrate 210 but also pixel transistors 221 on the lower surface thereof.

[Manufacturing method of semiconductor apparatus] FIGS. 12A, 12B, 13A, 13B, 14A, 14B, 15A, 15B, 16A, and 16B are diagrams illustrating an example of a procedure of a semiconductor apparatus manufacturing method in the third embodiment of the present technology. In FIGS. 12A, 12B, 13A, 13B, 14A, 14B, 15A, 15B, 16A, and 16B, FIGS. 12A, 13A, 14A, 15A, and 16A illustrate sectional views, and FIGS. 12B, 13B, 14B, 15B, and 16B illustrate top views.

Figure 12A:
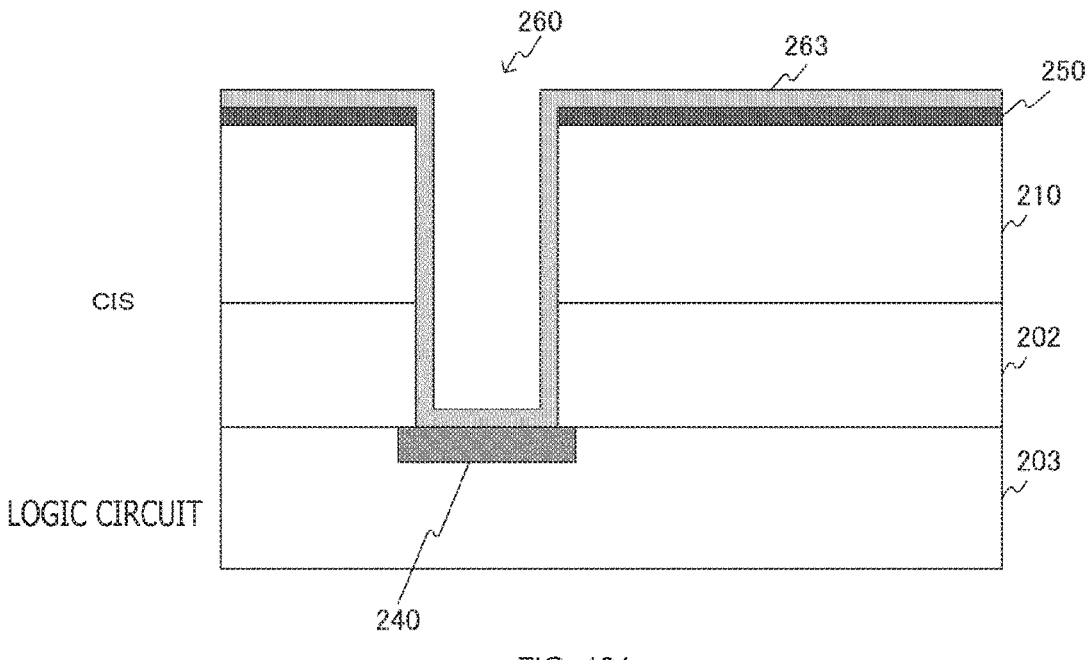
FIGS. 12A and 12B depict first diagrams illustrating an example of a procedure of a semiconductor apparatus manufacturing method in the third embodiment of the present technology.
Figure 12B:
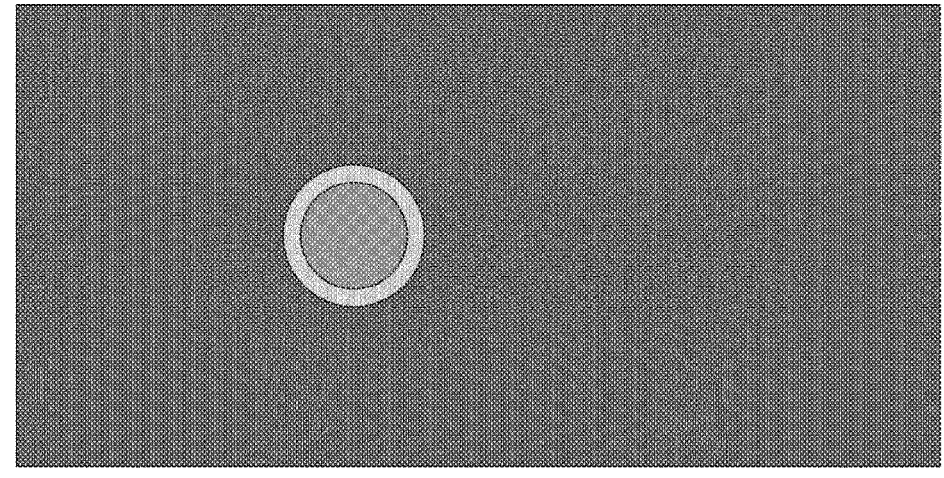

First, as illustrated in FIGS. 12A and 12B, an interlayer insulating film 202 of the CIS is stacked on an interlayer insulating film 203 of the logic circuit, and the silicon substrate 210 is stacked further thereon. The wiring 240 is formed in the interlayer insulating film 203. The wiring 240 includes, for example, aluminum as a material.

The insulating film 250 is formed by CVD on the upper surface of the silicon substrate 210. Then, the via 260 is formed by an opening being formed in the region that vertically penetrates the silicon substrate 210 from the insulating film 250 and stretches to the front of wiring 240 of the logic circuit.

Then, an insulating film is further formed from the upper surface by CVD. Thereafter, this insulating film is etched back, forming the side wall 263.

Figure 13A:
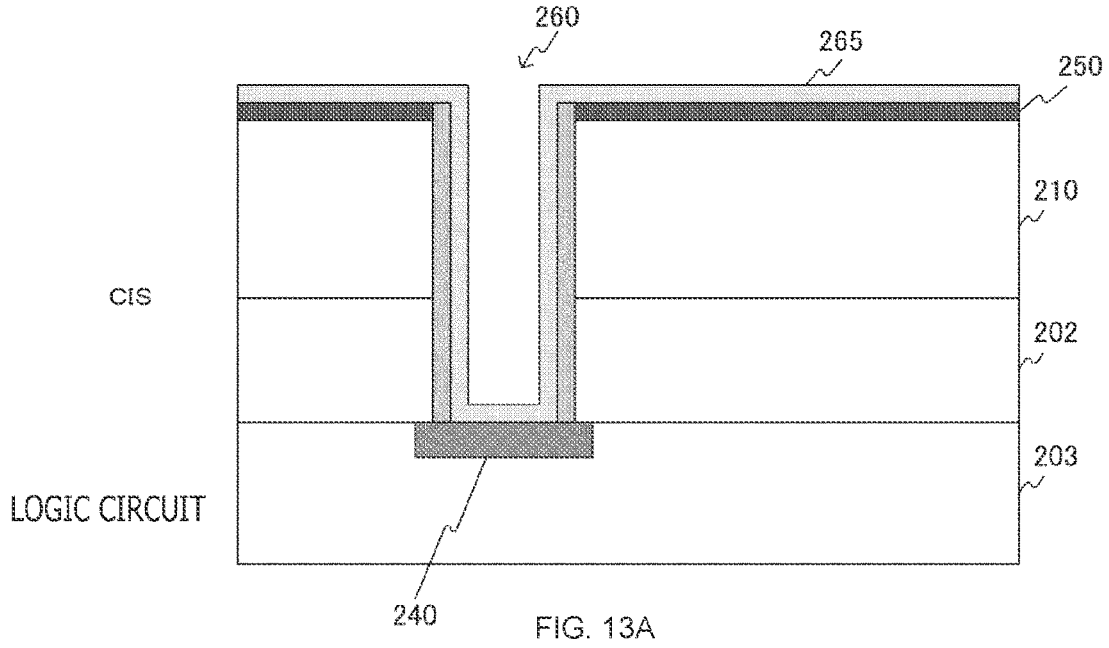
FIGS. 13A and 13B depict second diagrams illustrating an example of a procedure of the semiconductor apparatus manufacturing method in the third embodiment of the present technology.
Figure 13B:
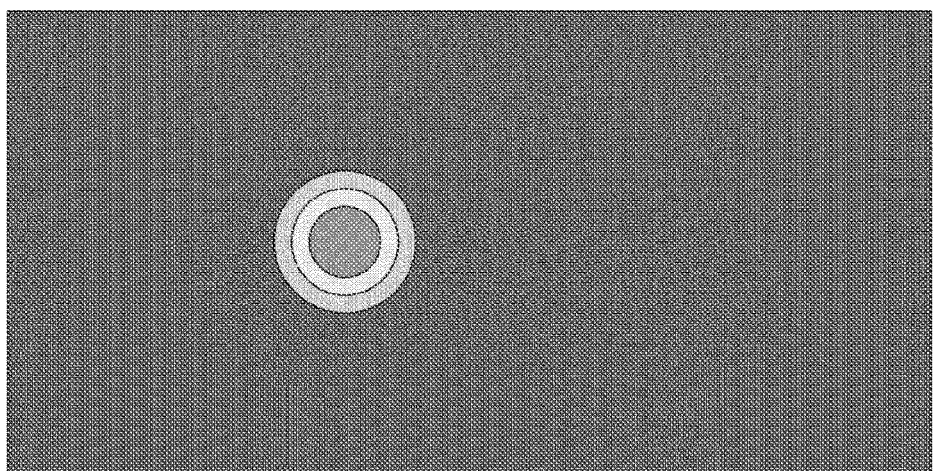
Figure 14A:
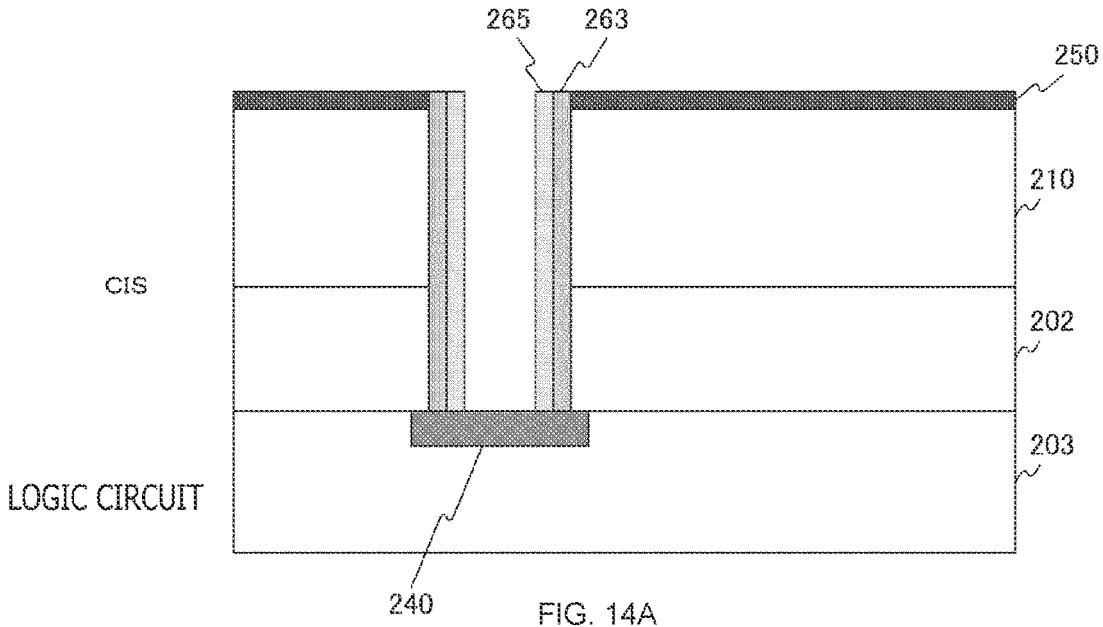
FIGS. 14A and 14B depict third diagrams illustrating an example of a procedure of the semiconductor apparatus manufacturing method in the third embodiment of the present technology.
Figure 14B:
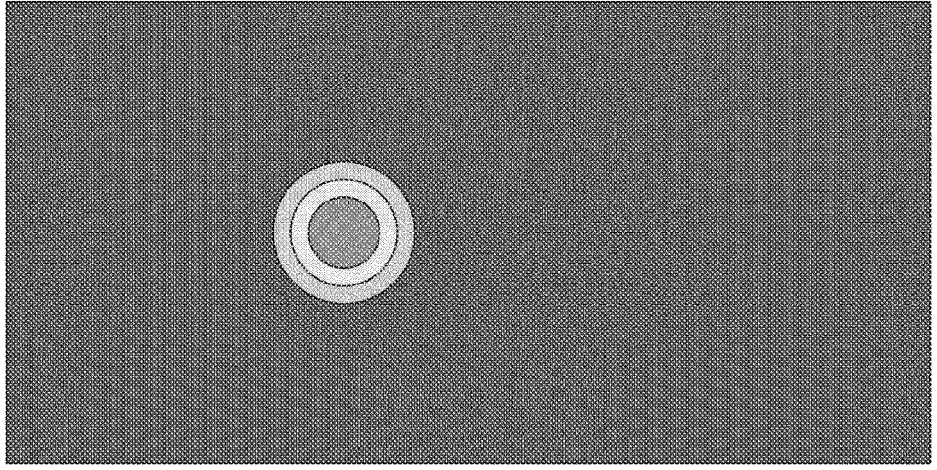

Next, as illustrated in FIGS. 13A and 13B, resin 265 is applied and cured by light irradiation. Thereafter, the resin 265 is etched back as illustrated in FIGS. 14A and 14B.

Figure 15A:
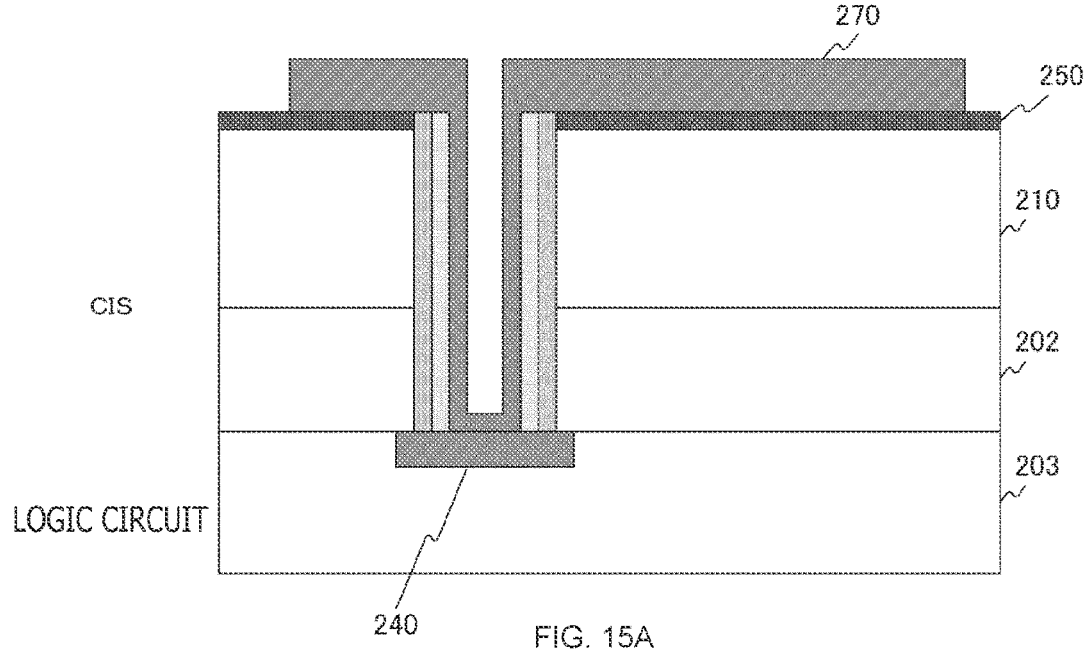
FIGS. 15A and 15B depict fourth diagrams illustrating an example of a procedure of the semiconductor apparatus manufacturing method in the third embodiment of the present technology.
Figure 15B:
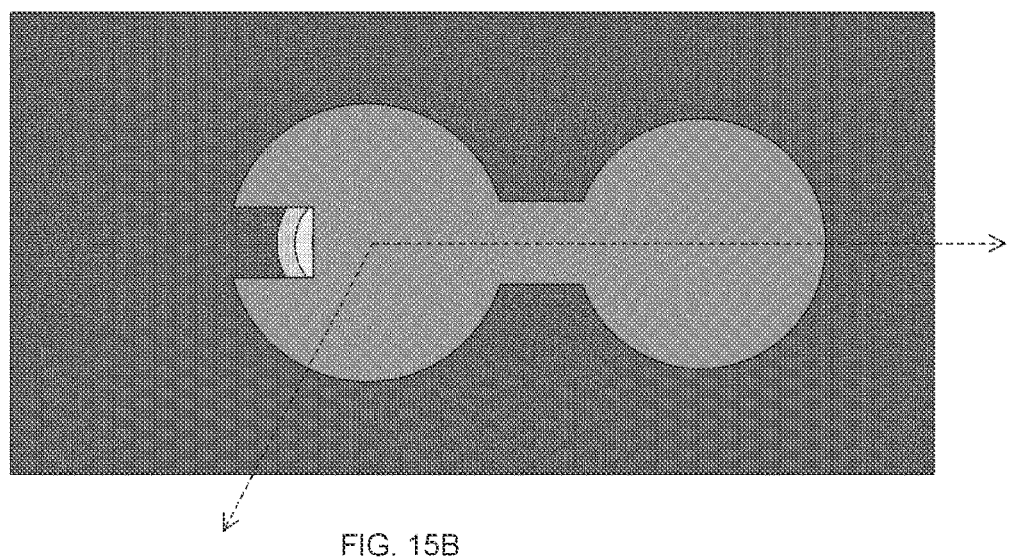

Subsequently, as illustrated in FIGS. 15A and 15B, the wiring 270 is formed. At this time, it is assumed that aluminum is used as a material, and a thin film is formed by sputtering. Then, the film is patterned by photoresist, and the resist is removed by dry etching.

The wiring 270 inside the resin 265 is maintained in contact with the wiring 270 outside the insulating film 250 and the wiring 240 of the interlayer insulating film 203. Further, an opening portion is provided in the wiring 270 outside the insulating film 250, and part of the resin 265 is exposed.

Figure 16A:
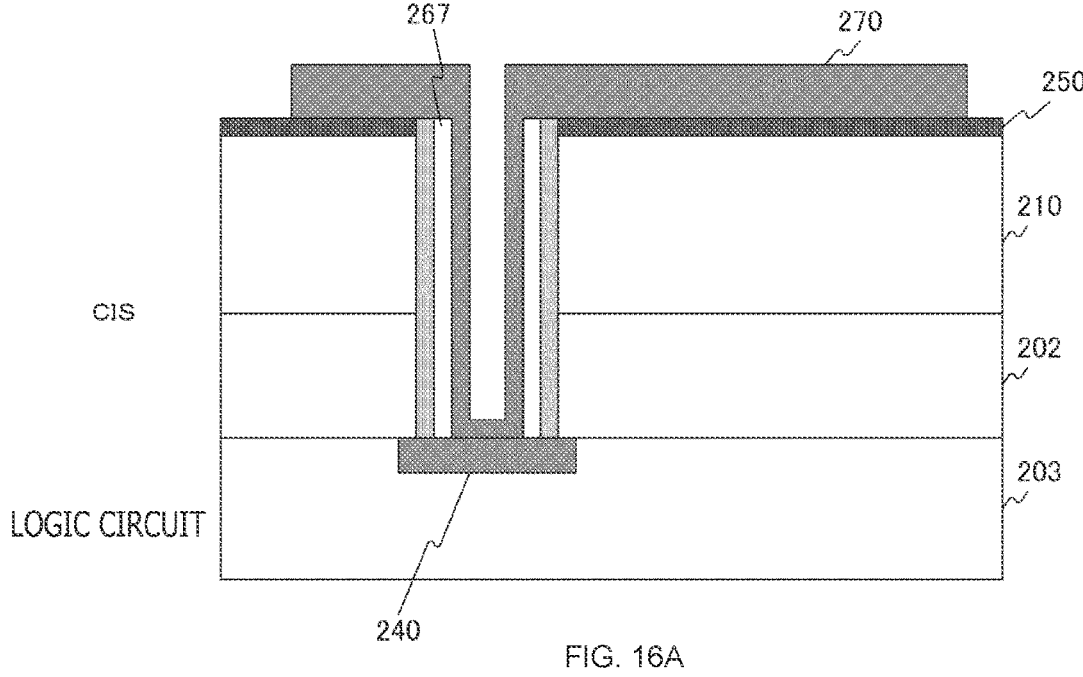
FIGS. 16A and 16B depict fifth diagrams illustrating an example of a procedure of the semiconductor apparatus manufacturing method in the third embodiment of the present technology.
Figure 16B:
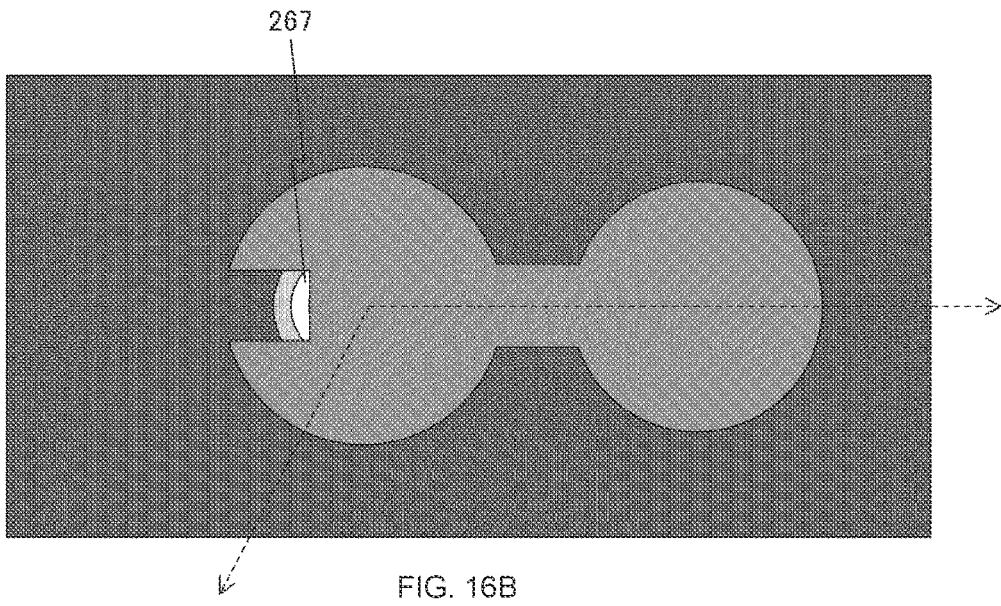

Further, in this state, as illustrated in FIGS. 16A and 16B, the resin 265 is removed by photolithography and wet etching, forming the cavity portion 267 between the wiring 270 and the side wall 263. At this time, the etchant used for wet etching is supplied from the opening portion of the wiring 270 outside the insulating film 250.

Thereafter, the insulating layer 280 is formed on top of the wiring 270 by CVD, and an opening for providing a pad is formed at the position corresponding to that of the wiring 270. This forms the above semiconductor apparatus structure.

As described above, in the third embodiment of the present technology, it is possible to reduce parasitic capacitance and enable high-speed operation of the imaging apparatus by forming, on the front surface of the CMOS image sensor, the cavity portion 267 that vertically penetrates the silicon substrate 210 around the wiring 270 inside the via 260.

4. Fourth Embodiment

[Structure of the Semiconductor Apparatus]

Figure 17A:
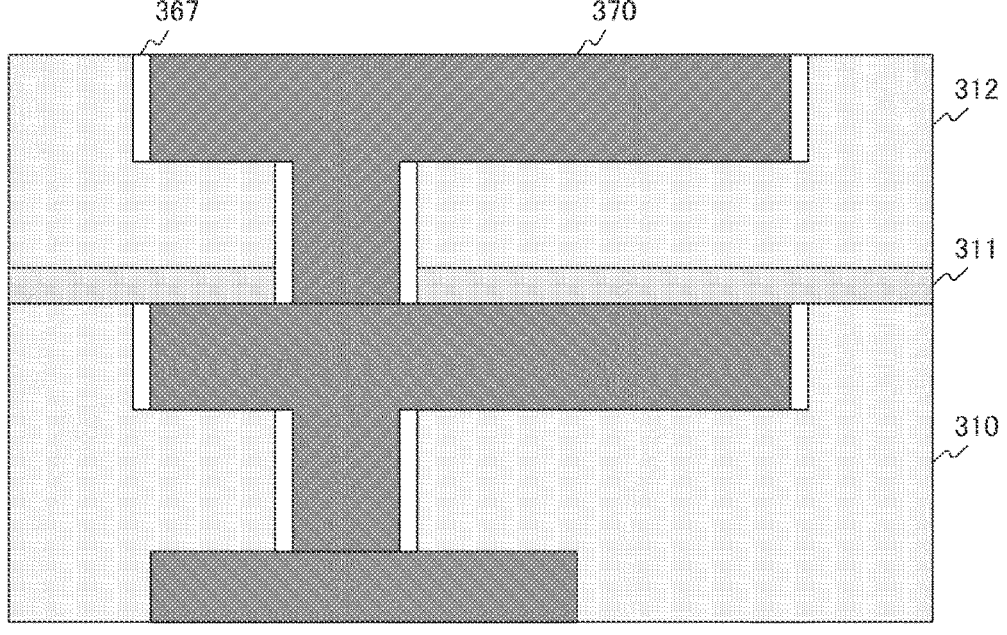
FIGS. 17A and 17B depict diagrams illustrating an example of a structure of a semiconductor apparatus in a fourth embodiment of the present technology.
Figure 17B:
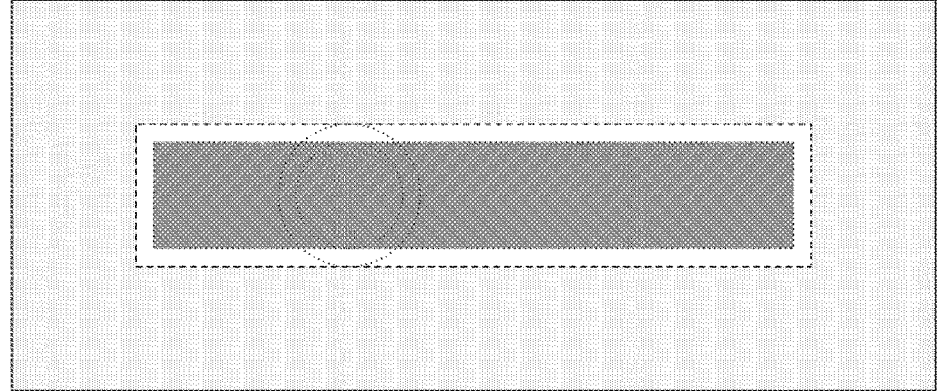

FIGS. 17A and 17B depict diagrams illustrating an example of a structure of a semiconductor apparatus in a fourth embodiment of the present technology. In FIGS. 17A and 17B, FIG. 17A illustrates a sectional view, and FIG. 17B illustrates a top view.

In this fourth embodiment, in the structure having interlayer insulating films 310 to 312 stacked, a cavity portion 367 is formed around wiring 370 inside the TSV that vertically penetrates the interlayer insulating films 310 to 312. That is, parasitic capacitance is reduced by the cavity portion 367 being provided in the interlayer insulating films 310 to 312 instead of in the silicon substrate 110 or the like as in the above embodiments. It should be noted that the interlayer insulating films 310 to 312 are examples of the given layer recited in the claims. Also, a description will be given of this example by assuming that copper is used as the material of the wiring 370.

[Manufacturing method of semiconductor apparatus] FIGS. 18A, 18B, 19A, 19B, 20A, 20B, 21A, 21B, 22A, 22B, 23A, and 23B are diagrams illustrating an example of a procedure of a semiconductor apparatus manufacturing method in the fourth embodiment of the present technology. In FIGS. 18A, 18B, 19A, 19B, 20A, 20B, 21A, 21B, 22A, 22B, 23A, and 23B, FIGS. 18A, 19A, 20A, 21A, 22A, and 23A illustrate sectional views, and FIGS. 18B, 19B. 20B, 21B, 22B, and 23B illustrate top views.

Figure 18A:
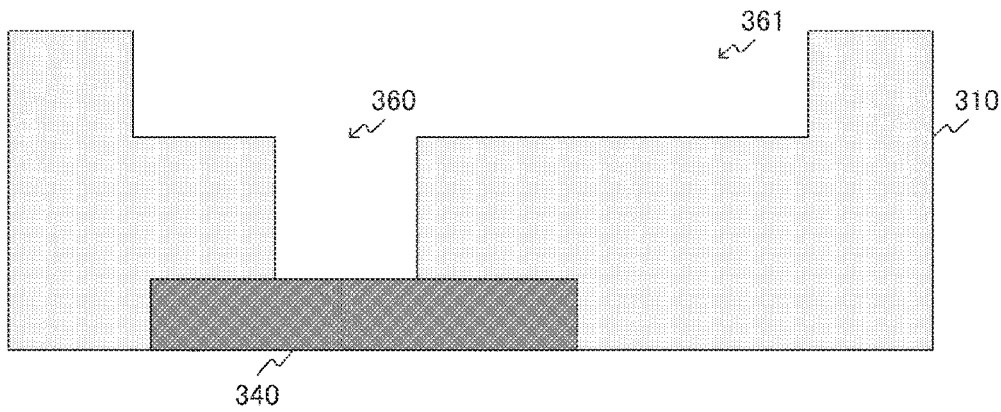
FIGS. 18A and 18B depict first diagrams illustrating an example of a procedure of a semiconductor apparatus manufacturing method in the fourth embodiment of the present technology.
Figure 18B:
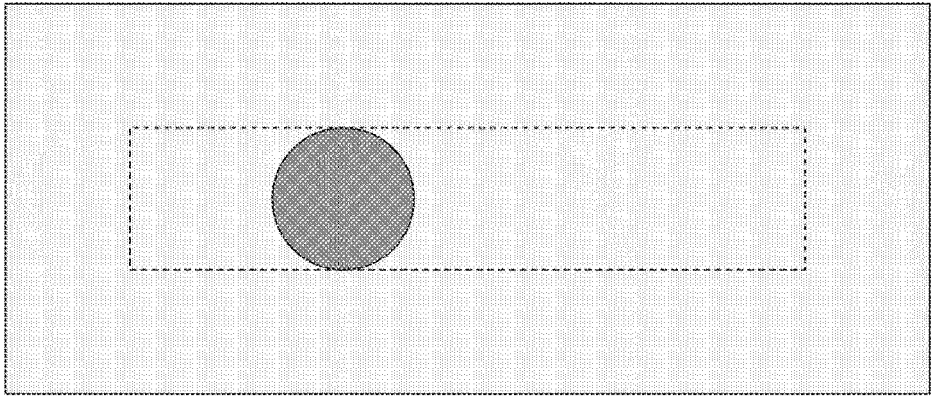

First, as illustrated in FIGS. 18A and 18B, wiring 340 is formed. The wiring 340 includes, for example, copper as a material. Next, the interlayer insulating film 310 is formed in such a manner as to include the wiring 340. Then, in the interlayer insulating film 310, a wiring trench 361 for forming new wiring is formed by resist patterning.

Subsequently, in the interlayer insulating film 310, a via 360 is formed by resist patterning, etching, and resist removal.

Figure 19A:
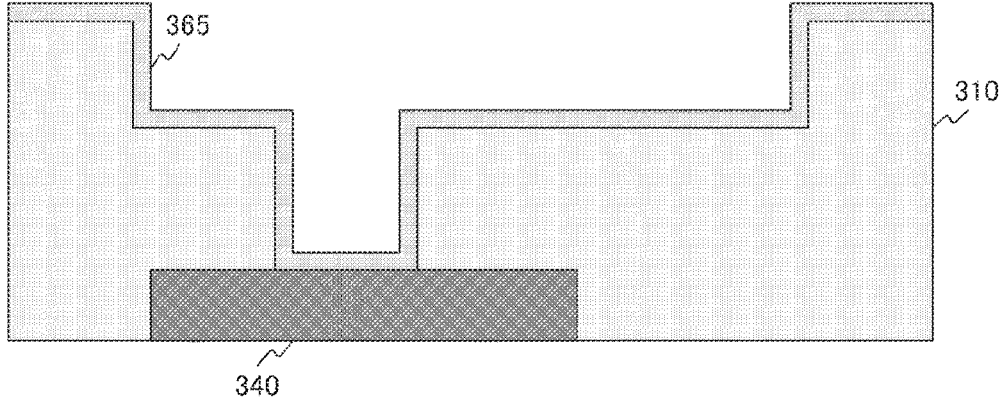
FIGS. 19A and 19B depict second diagrams illustrating an example of a procedure of the semiconductor apparatus manufacturing method in the fourth embodiment of the present technology.
Figure 19B:
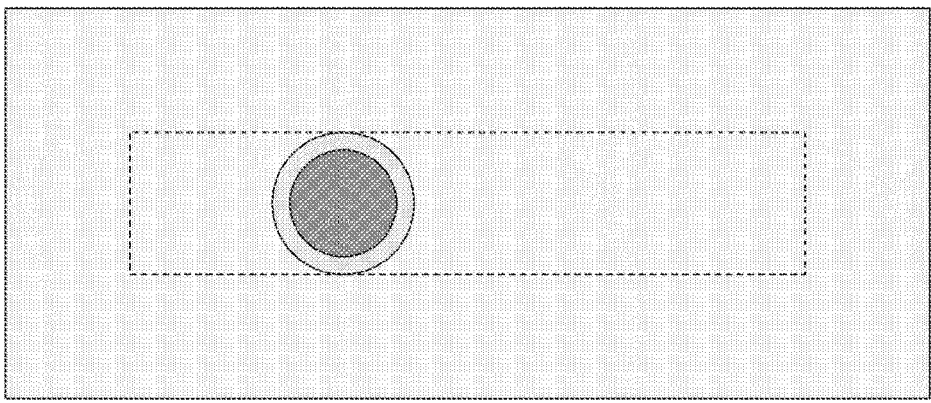
Figure 20A:
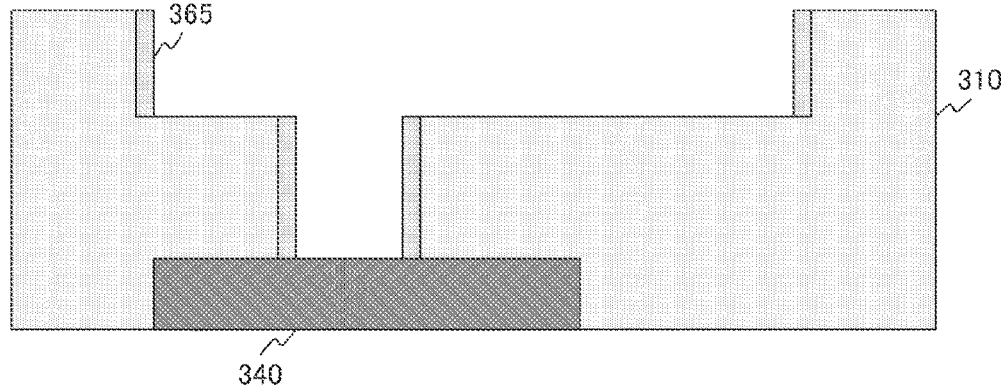
FIGS. 20A and 20B depict third diagrams illustrating an example of a procedure of the semiconductor apparatus manufacturing method in the fourth embodiment of the present technology.
Figure 20B:
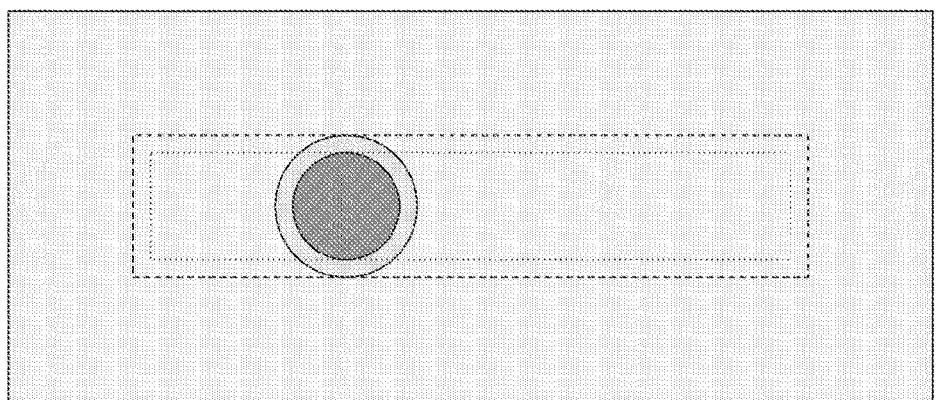

Next, as illustrated in FIGS. 19A and 19B, resin 365 is applied and cured by light irradiation. Thereafter, the resin 365 is etched back as illustrated in FIGS. 20A and 20B.

Figure 21A:
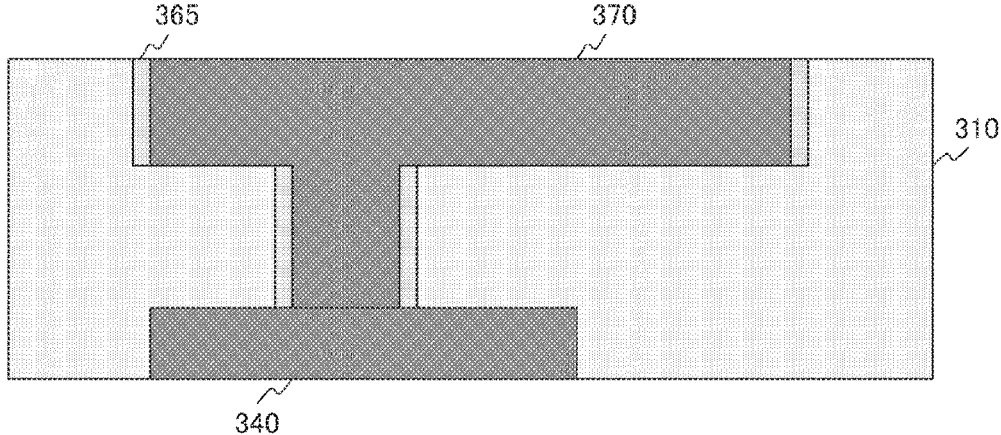
FIGS. 21A and 21B depict fourth diagrams illustrating an example of a procedure of the semiconductor apparatus manufacturing method in the fourth embodiment of the present technology.
Figure 21B:
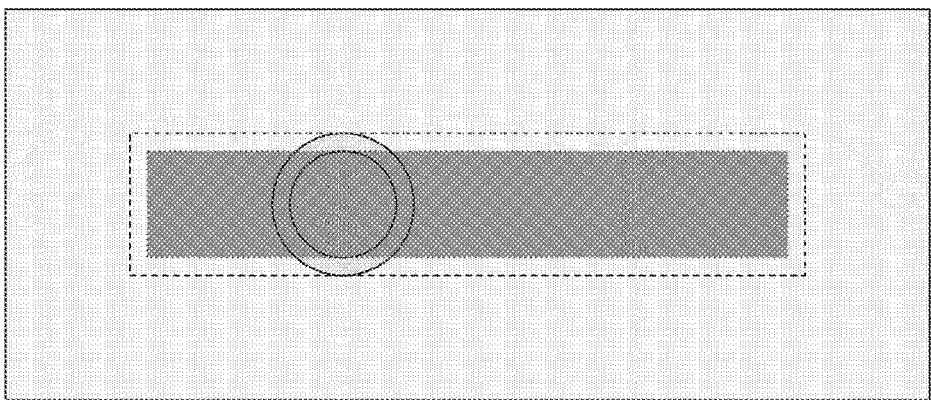

Subsequently, as illustrated in FIGS. 21A and 21B, copper is plated on the front surfaces of the via 360 and the wiring trench 361, and CMP (Chemical Mechanical Polishing) is performed. This forms the wiring 370. That is, in the fourth embodiment, it is assumed that a damascene process that forms wiring and a via at the same time is used.

At this time, the wiring 370 inside the via 360 is maintained in contact with the wiring 370 of the wiring trench 361 and the wiring 340. Also, the wiring 370 of the wiring trench 361 has a width smaller than a diameter of the via 360, thus forming an opening portion and exposing part of the resin 365.

Figure 22A:
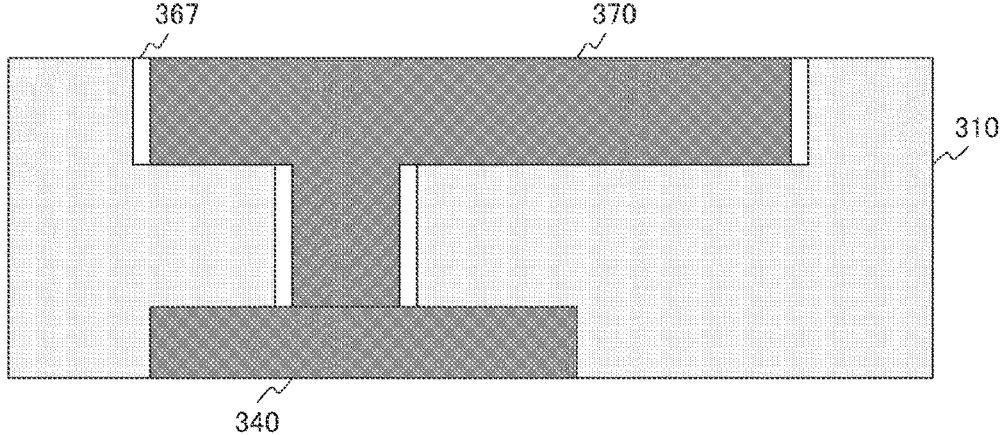
FIGS. 22A and 22B depict fifth diagrams illustrating an example of a procedure of the semiconductor apparatus manufacturing method in the fourth embodiment of the present technology.
Figure 22B:
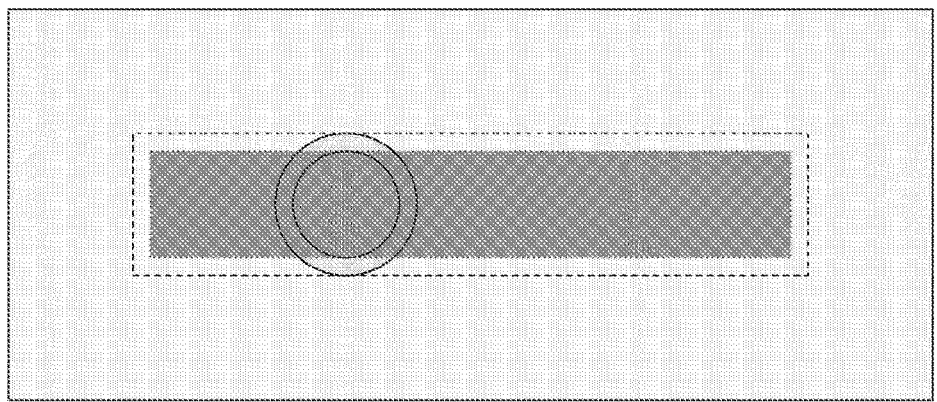

Further, in this state, as illustrated in FIGS. 22A and 22B, the resin 365 is removed by etching using a solvent, forming the cavity portion 367 around the wiring 370 inside the via 360. At this time, the solvent used for etching is supplied from the opening portion beside the wiring 370 of the interlayer insulating film 310.

Figure 23A:
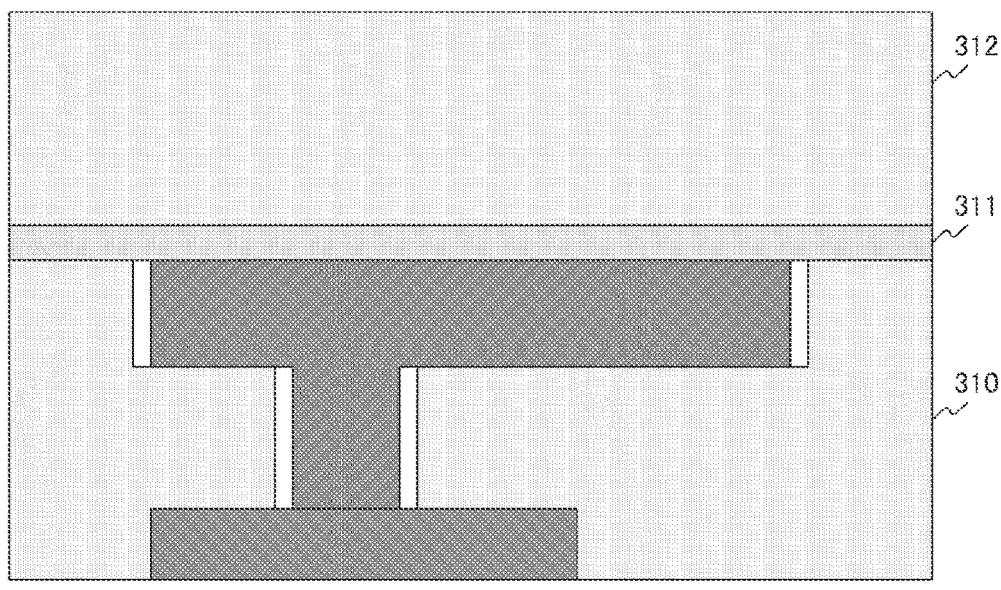
FIGS. 23A and 23B depict sixth diagrams illustrating an example of a procedure of the semiconductor apparatus manufacturing method in the fourth embodiment of the present technology.
Figure 23B:
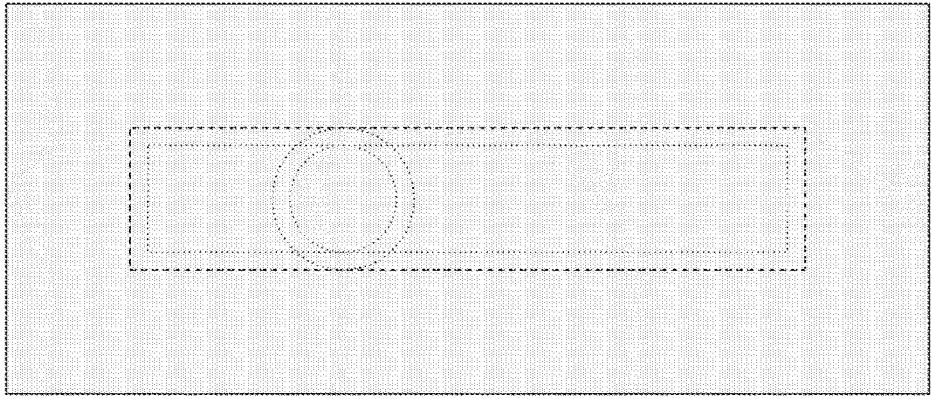

Thereafter, as illustrated in FIGS. 23A and 23B, interlayer insulating films 311 and 312 are sequentially formed on the interlayer insulating film 310. Then, wiring is also similarly formed in the interlayer insulating films 311 and 312. That is, a structure including a via and wiring having the cavity portion 367 is also similarly formed for multi-layer wiring by repeating the abovementioned process.

As described above, according to the fourth embodiment of the present technology, it is possible to reduce parasitic capacitance and enable high-speed operation of the imaging apparatus by forming, around the wiring 370 of the via 360, the cavity portion 367 in the damascene process.

5. Fifth Embodiment

Figure 24A:
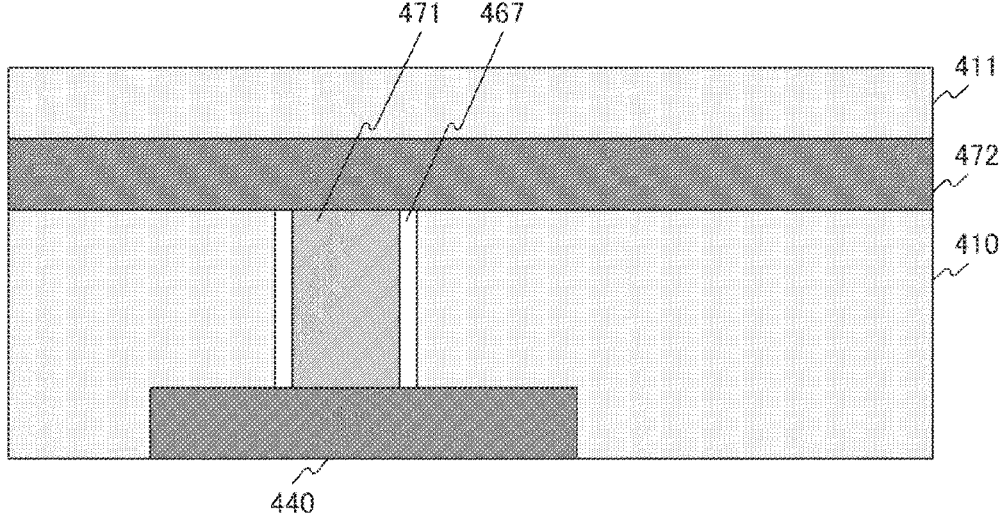
FIGS. 24A and 24B depict diagrams illustrating an example of a structure of a semiconductor apparatus in a fifth embodiment of the present technology.
Figure 24B:
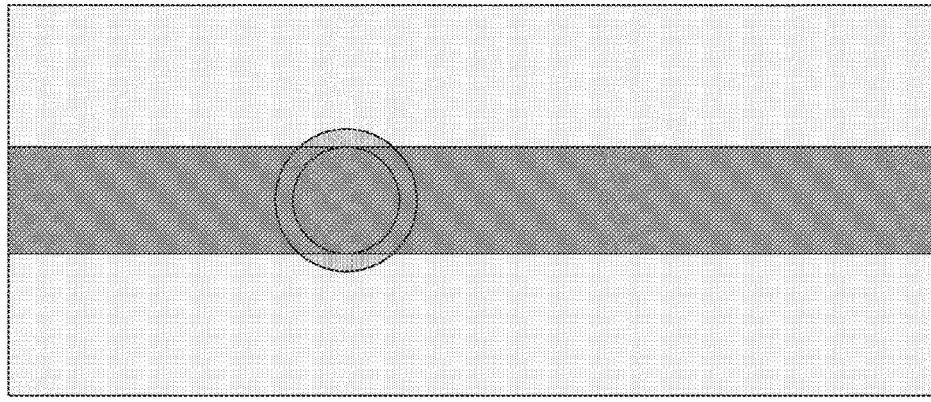

[Structure of semiconductor apparatus] FIGS. 24A and 24B depict diagrams illustrating an example of a structure of a semiconductor apparatus in a fifth embodiment of the present technology. In FIGS. 24A and 24B, FIG. 24A illustrates a sectional view, and FIG. 24B illustrates a top view.

In this fifth embodiment, a cavity portion 467 is formed around wiring 471 inside a via between wiring 440 and wiring 472. That is, parasitic capacitance is reduced by the cavity portion 467 being provided in an interlayer insulating film 410. It should be noted that the interlayer insulating film 410 is an example of the given layer recited in the claims.

[Manufacturing method of semiconductor apparatus] FIGS. 25A, 25B, 26A, 26B, 27A, 27B, 28A, 28B, 29A, [to] and 29B are diagrams illustrating an example of a procedure of a semiconductor apparatus manufacturing method in the fifth embodiment of the present technology. In FIGS. 25A, 25B, 26A, 26B, 27A, 27B, 28A, 28B, 29A, and 29B, FIGS. 25A, 26A, 27A, 28A, and 29A illustrate sectional views, and FIGS. 25B, 26B, 27B, 28B, and 29B illustrate top views.

Figure 25A:
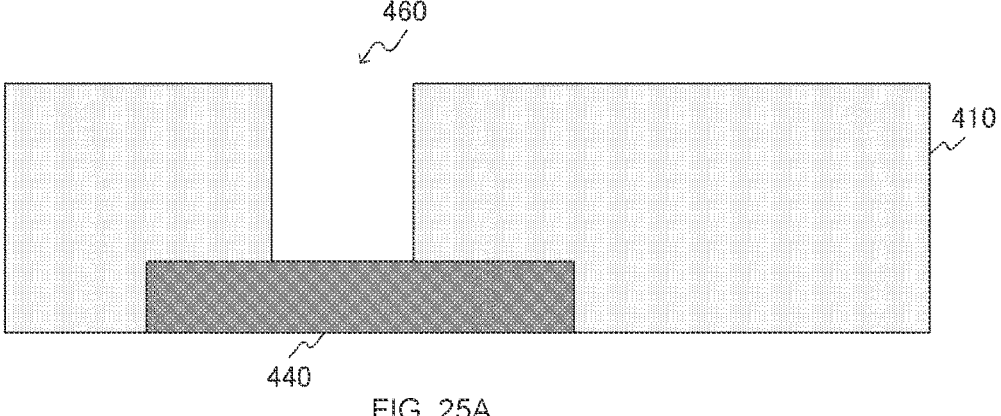
FIGS. 25A and 25B depict first diagrams illustrating an example of a procedure of a semiconductor apparatus manufacturing method in the fifth embodiment of the present technology.
Figure 25B:
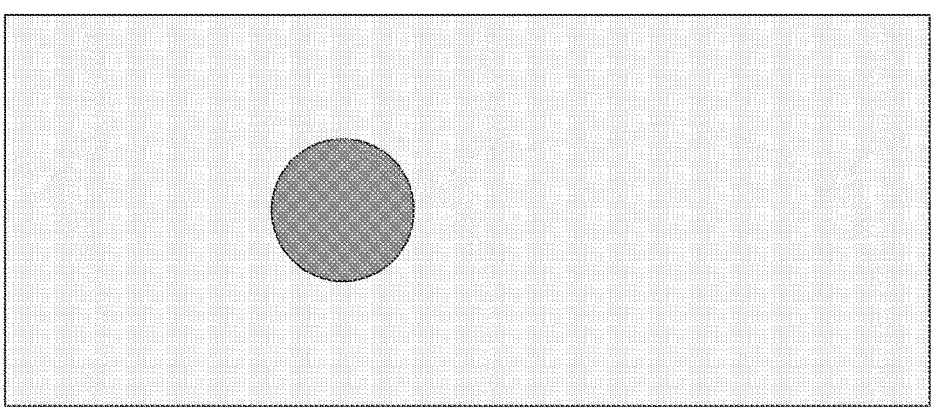

First, as illustrated in FIGS. 25A and 25B, the wiring 440 is formed. The wiring 440 includes, for example, aluminum or copper as a material. Next, the interlayer insulating film 410 is formed in such a manner as to include the wiring 440. Then, in the interlayer insulating film 410, a via 460 is formed by resist patterning, etching, and resist removal.

Figure 26A:
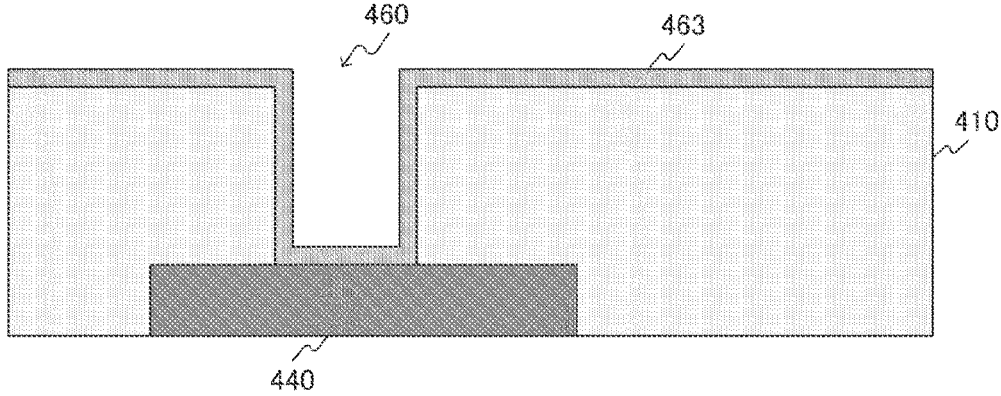
FIGS. 26A and 26B depict second diagrams illustrating an example of a procedure of the semiconductor apparatus manufacturing method in the fifth embodiment of the present technology.
Figure 26B:
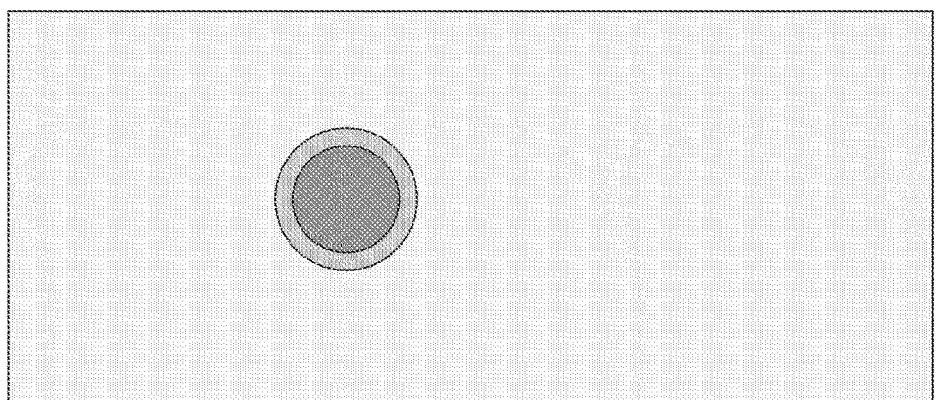
Figure 27A:
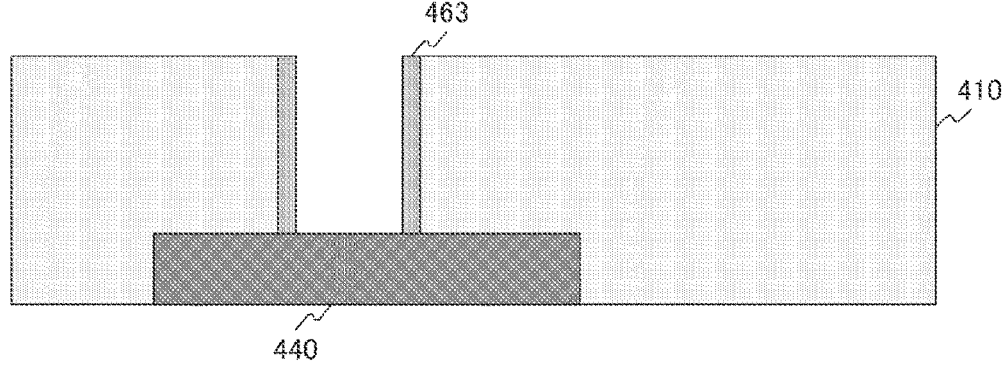
FIGS. 27A and 27B depict third diagrams illustrating an example of a procedure of the semiconductor apparatus manufacturing method in the fifth embodiment of the present technology.
Figure 27B:
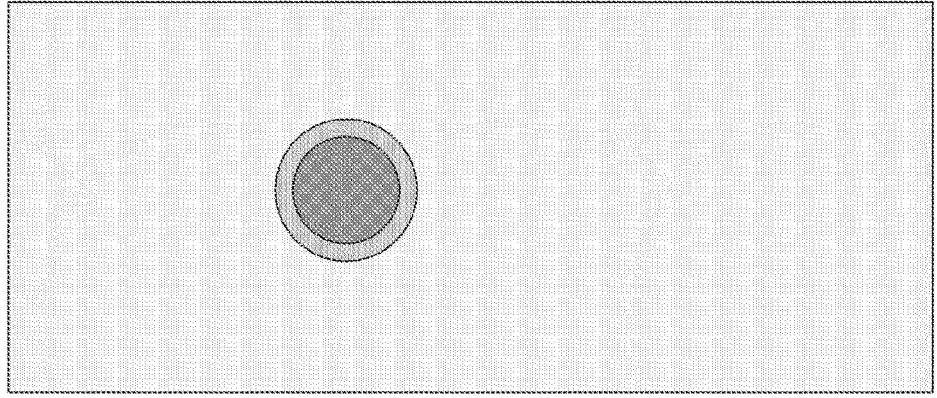

Next, as illustrated in FIGS. 26A and 26B, resin 463 is applied and cured by light irradiation. Thereafter, the resin 463 is etched back as illustrated in FIGS. 27A and 27B.

Figure 28A:
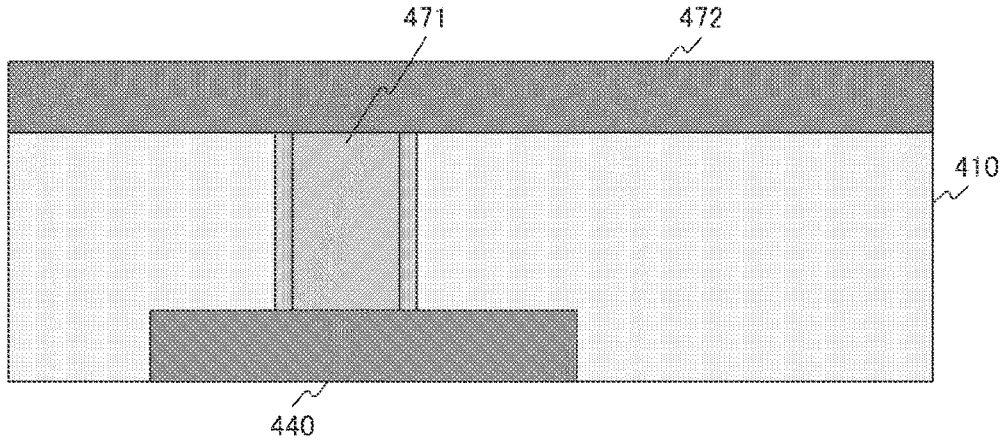
FIGS. 28A and 28B depict fourth diagrams illustrating an example of a procedure of the semiconductor apparatus manufacturing method in the fifth embodiment of the present technology.
Figure 28B:
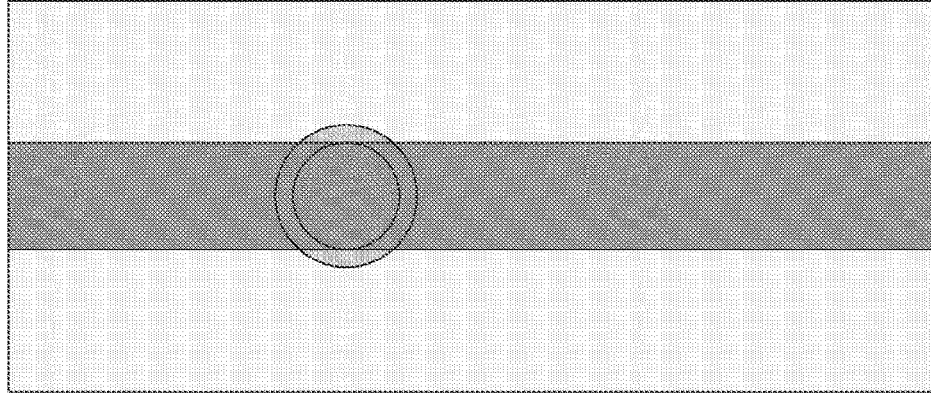

Subsequently, as illustrated in FIGS. 28A and 28B, tungsten (W) or the like is embedded into the via 460, and CMP is performed. This forms the wiring 471.

Then, the via 460 is formed by resist patterning, metal etching, and resist removal. The wiring 472 is formed.

At this time, the wiring 472 inside the via 460 is maintained in contact with the wiring 470 and the wiring 440. Also, the wiring 472 has the width smaller than the diameter of the via 460, thus forming an opening portion and exposing part of the resin 463.

Figure 29A:
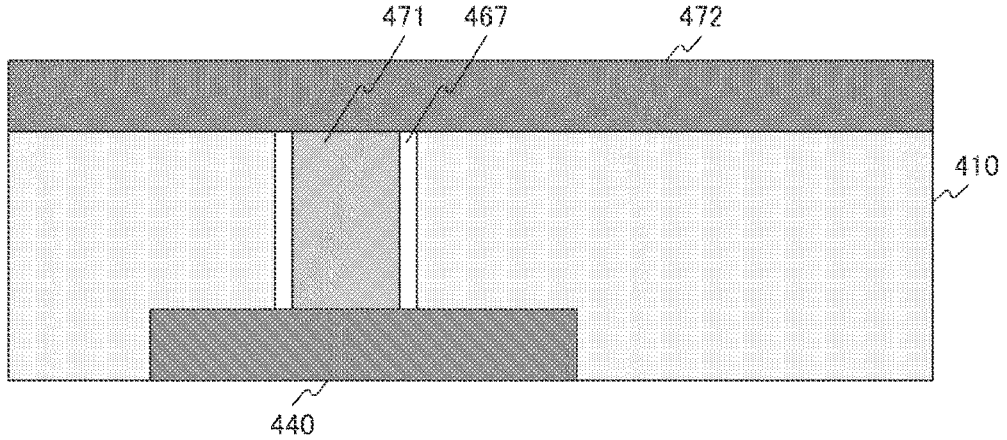
FIGS. 29A and 29B depict fifth diagrams illustrating an example of a procedure of the semiconductor apparatus manufacturing method in the fifth embodiment of the present technology.
Figure 29B:
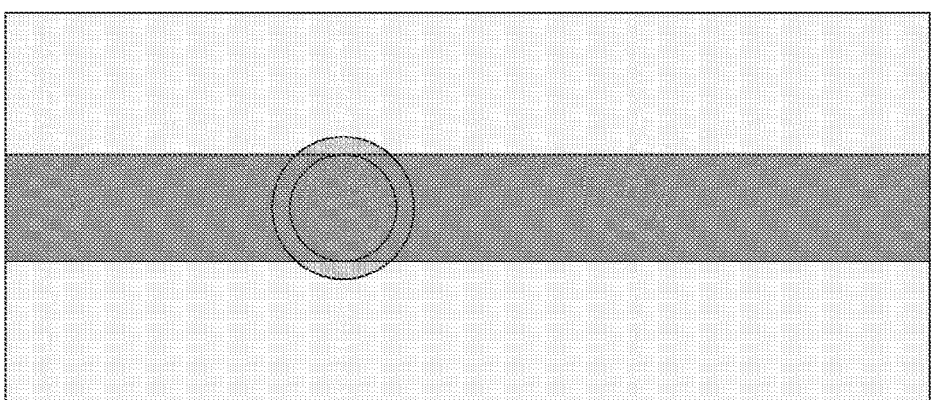

Then, in this state, as illustrated in FIGS. 29A and 29B, the resin 463 is removed by etching using a solvent, forming the cavity portion 467 around the wiring 471 inside the via 460. At this time, the solvent used for etching is supplied from the opening portion beside the wiring 472 of the interlayer insulating film 410.

Thereafter, an interlayer insulating film 411 is formed on top of the wiring 472 by CVD. This forms the above semiconductor apparatus structure.

As described above, according to the fifth embodiment of the present technology, it is possible to reduce parasitic capacitance and enable high-speed operation of the imaging apparatus by forming the cavity portion 467 around the wiring 471 inside the via 460 of the interlayer insulating film 410.

6. Sixth Embodiment

While examples in which a vertically penetrating cavity portion is provided inside the TSV have been described in the above embodiments, such a cavity portion may be provided outside the TSV. It should be noted that although a description will be given of an example in which a cavity portion is provided only outside the TSV in the following embodiments, a cavity portion may also be provided inside the TSV in combination with the above embodiments.

Figure 30A:
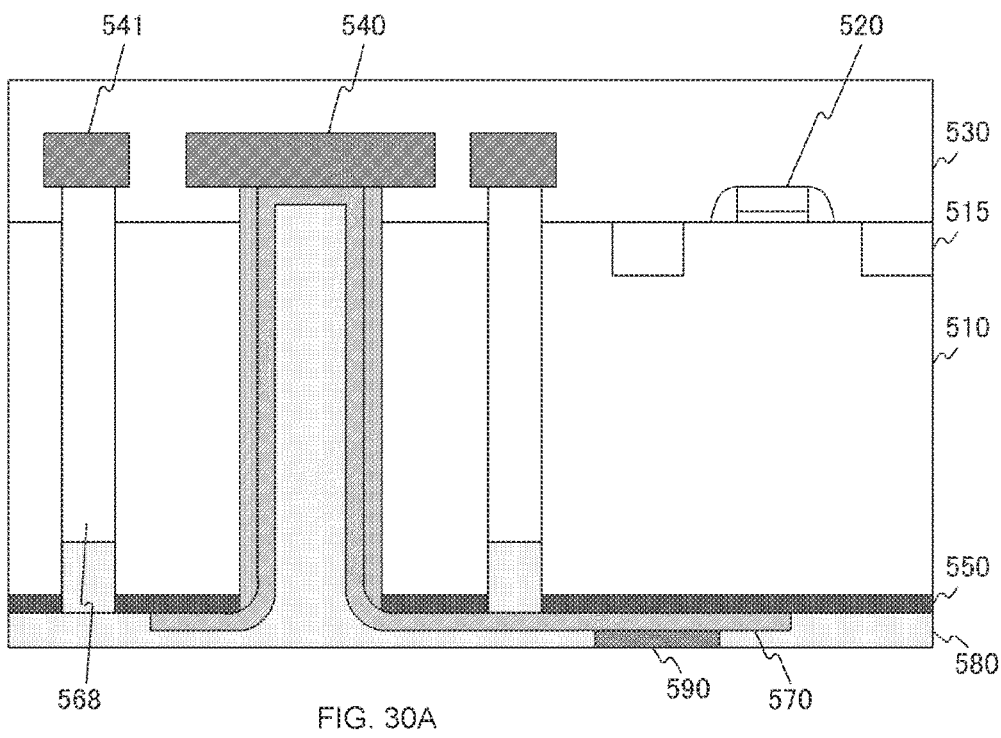
FIGS. 30A and 30B depict diagrams illustrating an example of a structure of a semiconductor apparatus in a sixth embodiment of the present technology.
Figure 30B:
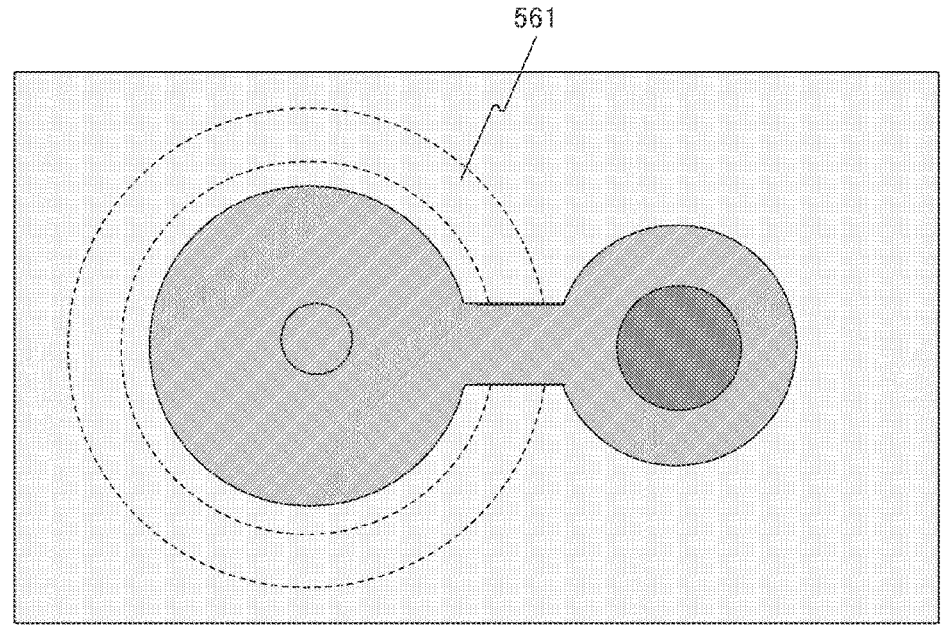

[Structure of semiconductor apparatus] FIGS. 30A and 30B depict diagrams illustrating an example of a structure of a semiconductor apparatus in a sixth embodiment of the present technology. In FIGS. 30A and 30B, FIG. 30A illustrates a sectional view, and FIG. 30B illustrates a back view.

In this sixth embodiment, a vertically penetrating via 561 is formed in a ring shape around the TSV which is a center. The via 561 includes a cavity portion 568 in a region sandwiched between upside wiring 541 and a downside insulating layer 580. It is possible to reduce parasitic capacitance in the TSV by providing the cavity portion 568. It should be noted that the via 561 is an example of a surrounding trench recited in the claims.

[Manufacturing method of semiconductor apparatus] FIGS. 31A, 31B, 32A, 32B, 33A, 33B, 34A, 34B, 35A, and 35B are diagrams illustrating an example of a procedure of a semiconductor apparatus manufacturing method in the sixth embodiment of the present technology. In FIGS. 31A, 31B, 32A, 32B, 33A, 33B, 34A, 34B, 35A, and 35B, FIGS. 31A, 32A, 33A, 34A, and 35A illustrate sectional views, and FIGS. 31B, 32B, 33B, 34B, and 35B illustrate back views.

Figure 31A:
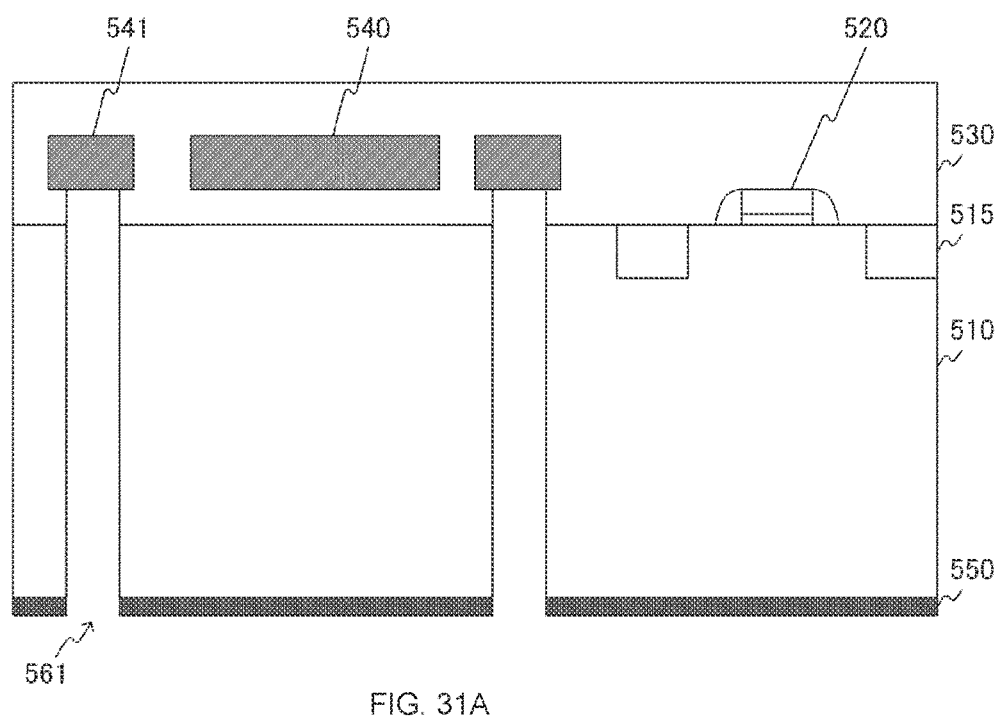
FIGS. 31A and 31B depict first diagrams illustrating an example of a procedure of the semiconductor apparatus manufacturing method in the sixth embodiment of the present technology.
Figure 31B:
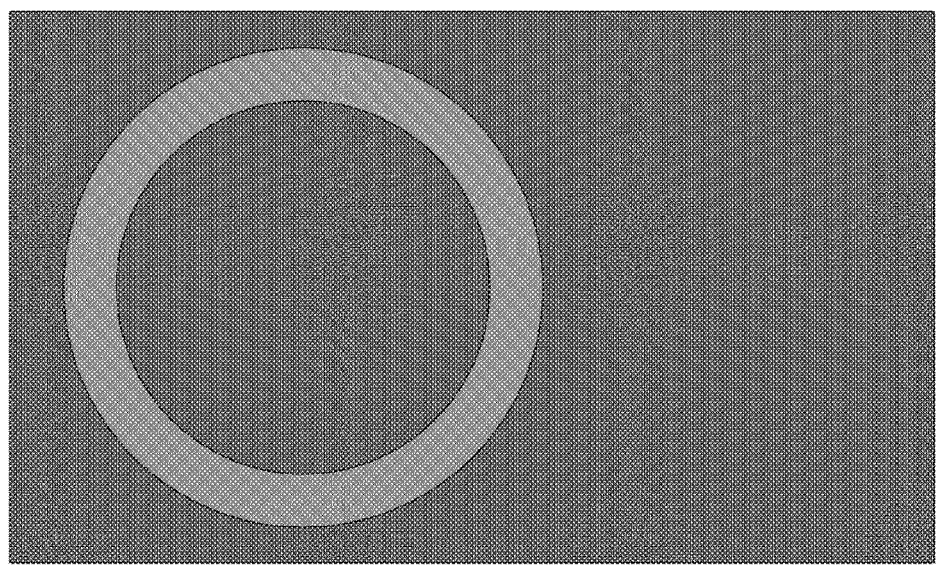

First, as illustrated in FIGS. 31A and 31B, a transistor 520 is formed on a silicon substrate 510. Also, an interlayer insulating film 530 is formed on the upper surface side of the silicon substrate 510. Wiring 540 and wiring 541 are formed in the interlayer insulating film 530. The wiring 540 and the wiring 541 include, for example, copper as a material. It should be noted that the silicon substrate 510 is an example of the given layer recited in the claims.

Also, an insulating film 550 is formed on the lower surface side of the silicon substrate 510. Further, an opening of the via 561 is formed in a region that vertically penetrates in a ring shape the silicon substrate 510 from the insulating film 550 and stretches to the front of the wiring 541.

Figure 32A:
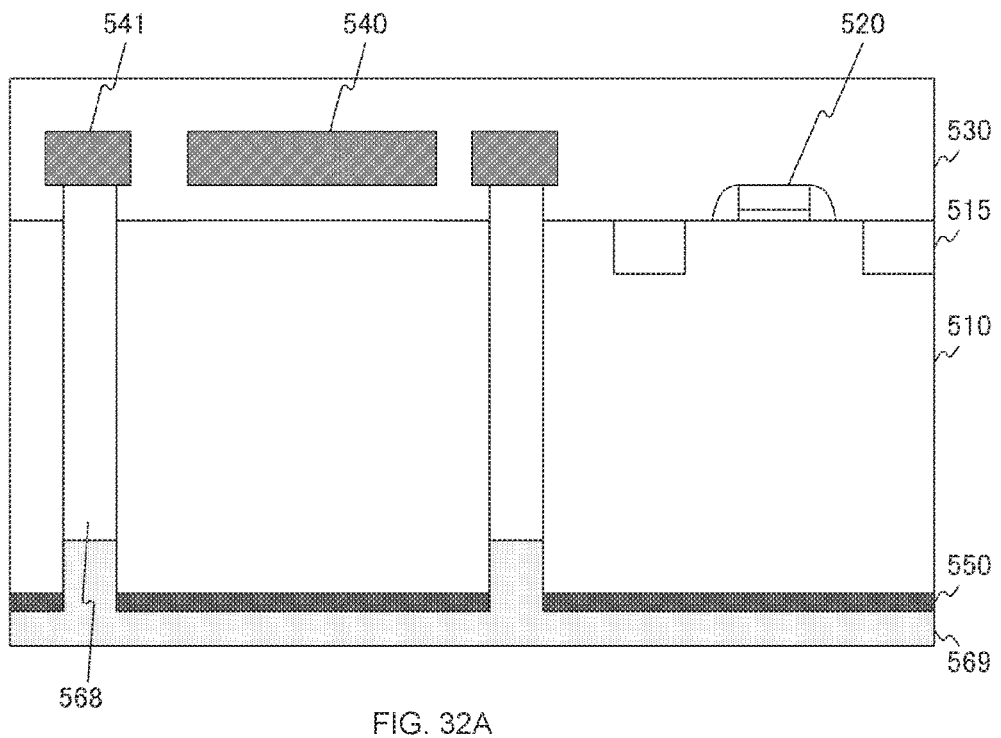
FIGS. 32A and 32B depict second diagrams illustrating an example of a procedure of the semiconductor apparatus manufacturing method in the sixth embodiment of the present technology.
Figure 32B:
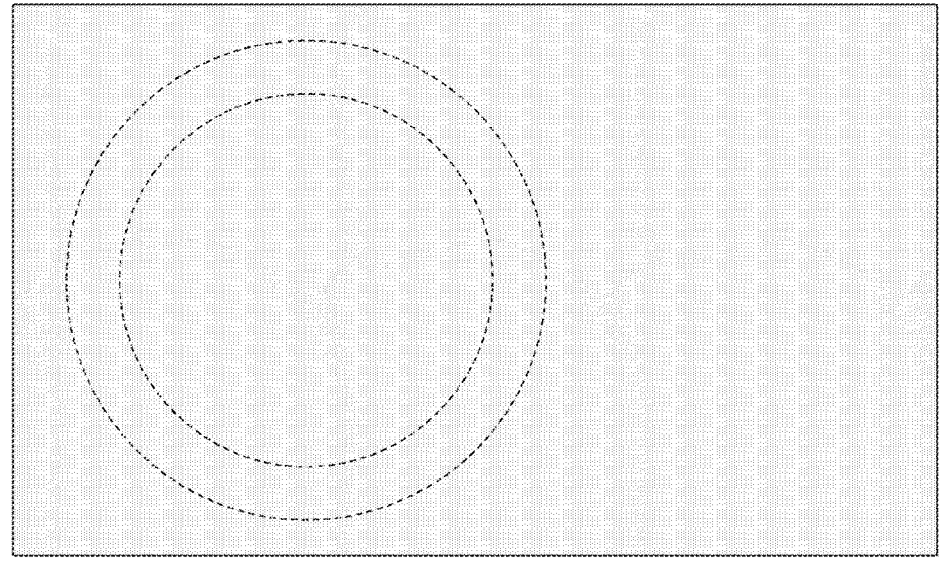

Next, as illustrated in FIGS. 32A and 32B, an insulating film 569 is formed on the lower surface side of the insulating film 550. Although CVD is used to form the insulating film 569, CVD in this case is performed in a poor step coverage condition. This ensures that while the insulating film 569 is formed in a downside of the via 561, the insulating film 569 is not formed in an interior (upside) of the via 561, making it possible to secure the cavity portion 568.

Figure 33A:
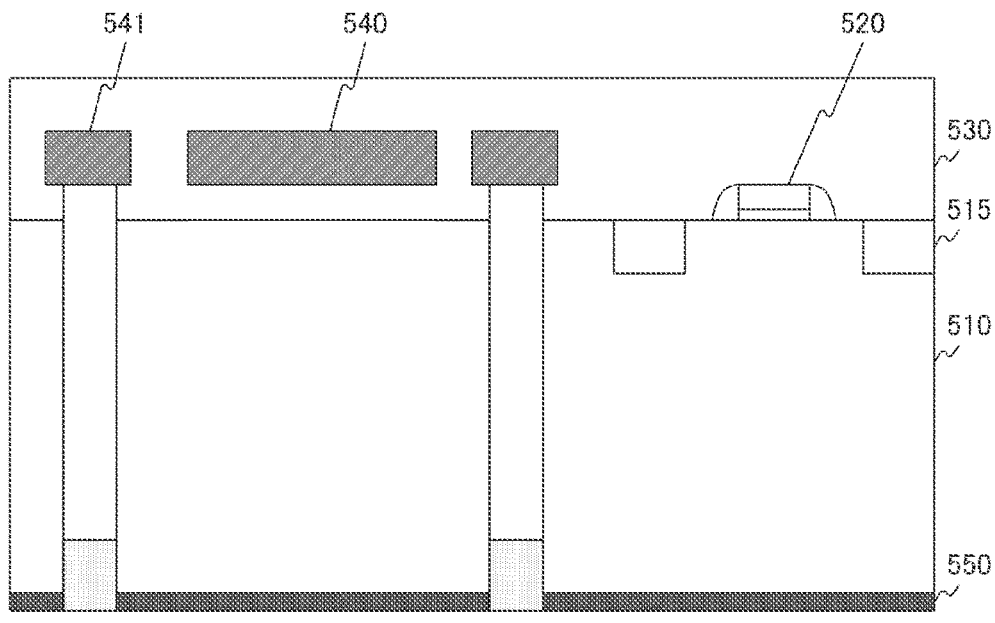
FIGS. 33A and 33B depict third diagrams illustrating an example of a procedure of the semiconductor apparatus manufacturing method in the sixth embodiment of the present technology.
Figure 33B:
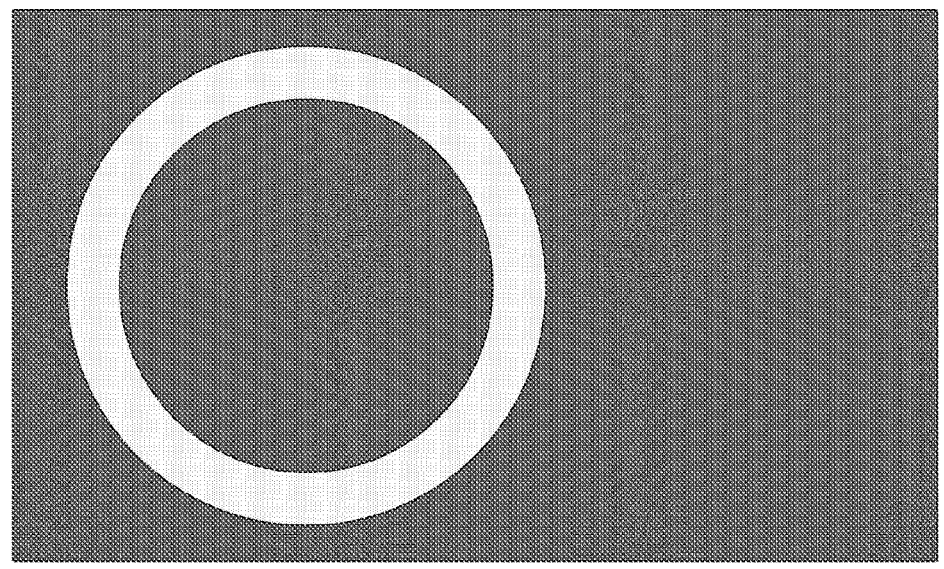

Next, as illustrated in FIGS. 33A and 33B, the insulating film 569 under the insulating film 550 is shaved by CMP, leaving the insulating film 569 unshaved inside the via 561.

Figure 34A:
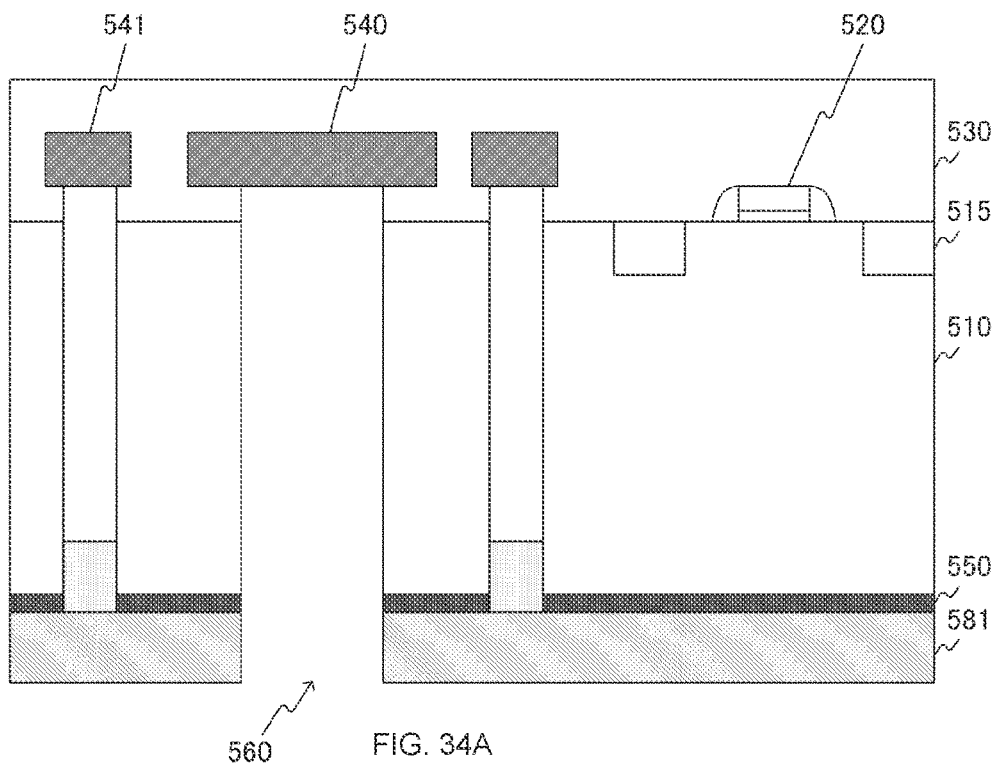
FIGS. 34A and 34B depict fourth diagrams illustrating an example of a procedure of the semiconductor apparatus manufacturing method in the sixth embodiment of the present technology.
Figure 34B:
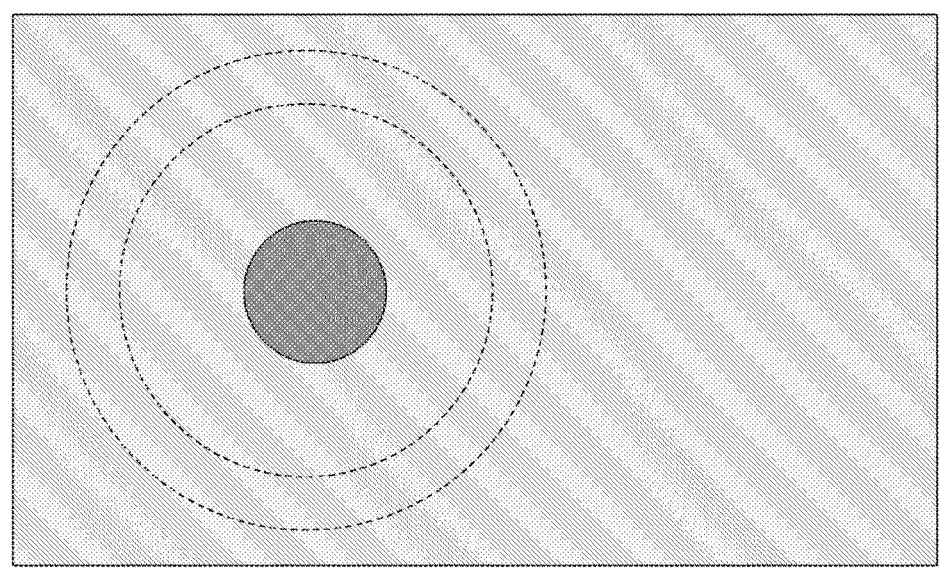

Then, as illustrated in FIGS. 34A and 34B, photoresist 581 for forming an opening in the TSV is patterned, and a via 560 is formed by etching. Thereafter, the photoresist 581 is removed.

Figure 35A:
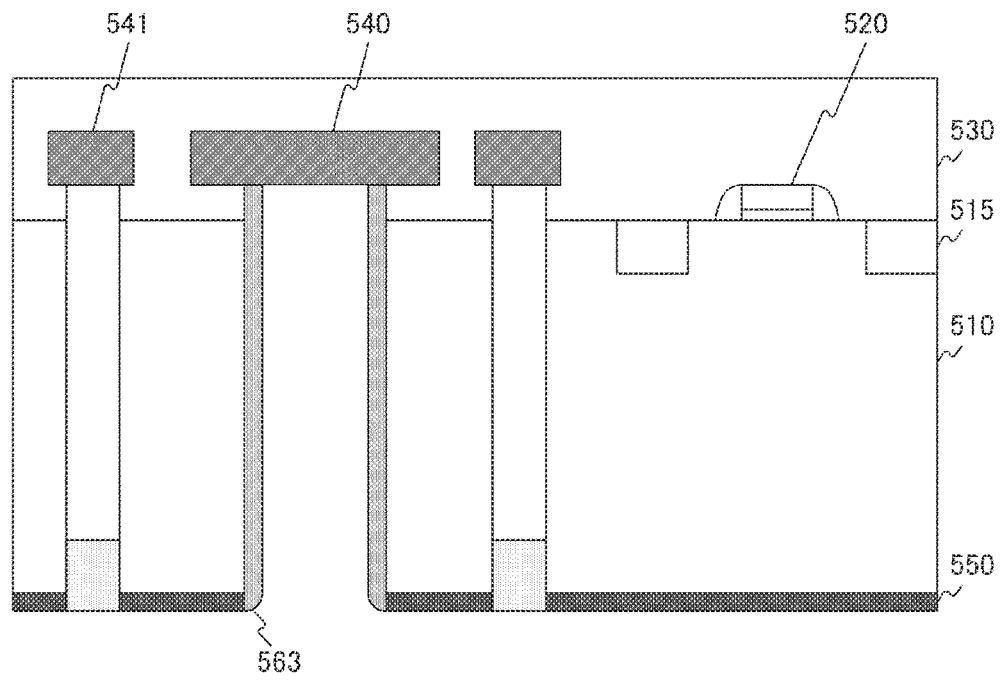
FIGS. 35A and 35B depict fifth diagrams illustrating an example of a procedure of the semiconductor apparatus manufacturing method in the sixth embodiment of the present technology.
Figure 35B:
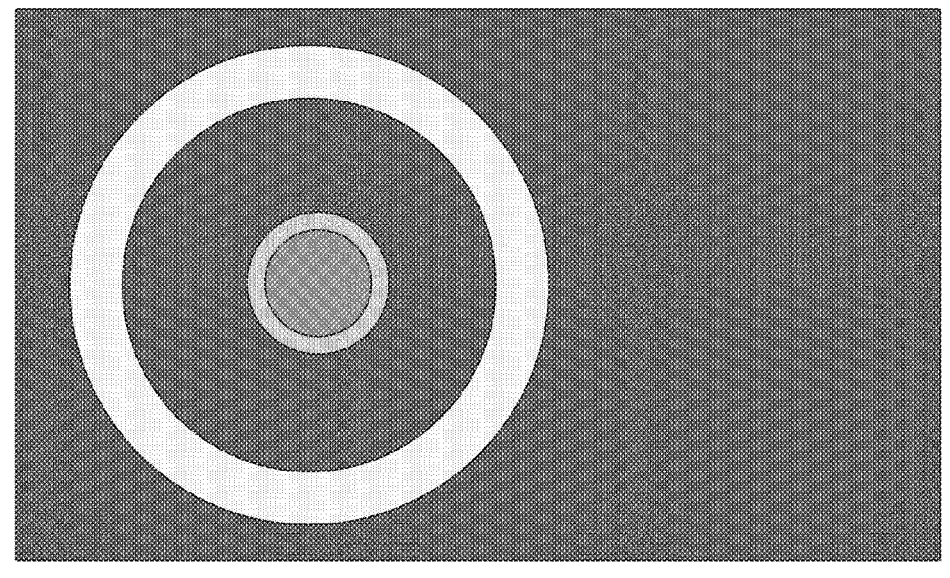

Subsequently, as illustrated in FIGS. 35A and 35B, a side wall 563 is formed inside the via 560. The side wall 563 is formed by CVD and etchback of an insulating film.

Thereafter, wiring 570 is formed inside the side wall 563. The wiring 570 is formed in a manner of being pulled out to an outside of the insulating film 550. The wiring 570 includes, for example, copper as a material. Further, an insulating layer 580 is formed under the wiring 570, an opening is provided at a position corresponding to that of the wiring 570, and a bump 590 is formed in the opening. This forms the above semiconductor apparatus structure.

Thus, according to the sixth embodiment of the present technology, it is possible to reduce parasitic capacitance and enable high-speed operation of the imaging apparatus by providing the vertically penetrating via 561 in a ring-shape outside the inside of the via 560 of the silicon substrate 510 and forming the cavity portion 568 in the via 561.

7. Seventh Embodiment

Figure 36A:
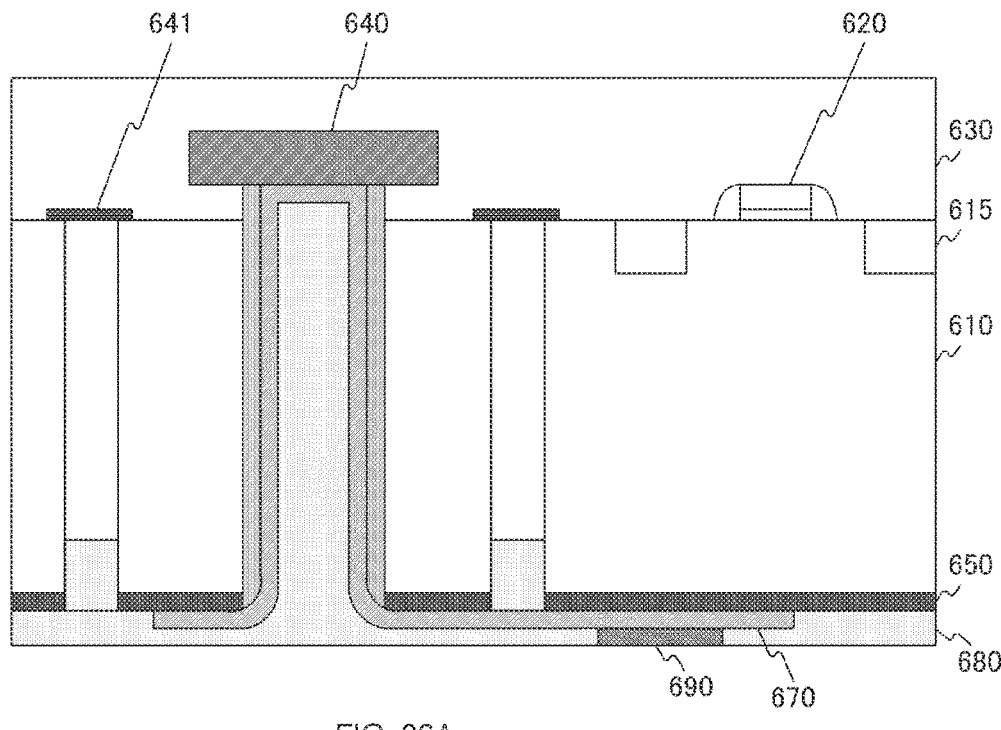
FIGS. 36A and 36B depict diagrams illustrating an example of a structure of a semiconductor apparatus in a seventh embodiment of the present technology.
Figure 36B:
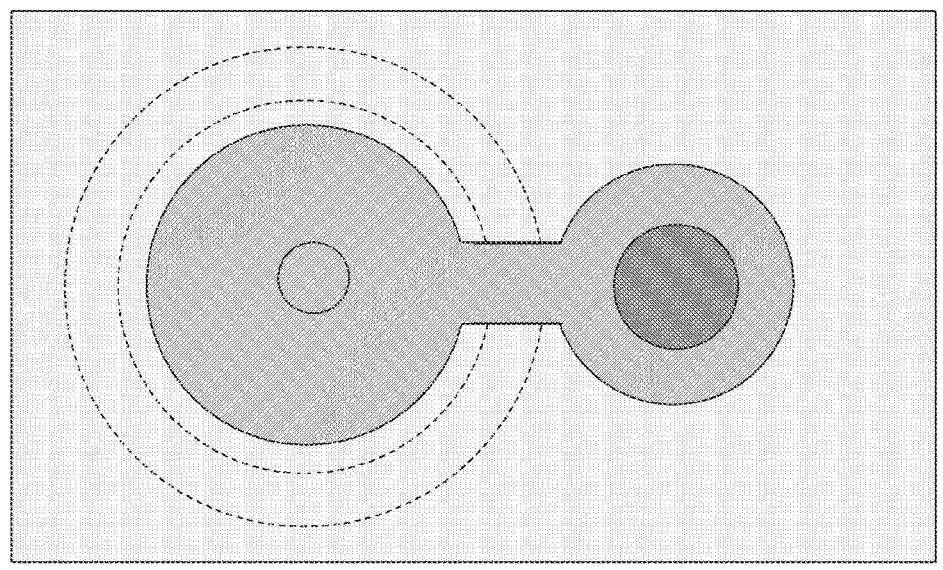

[Structure of semiconductor apparatus] FIGS. 36A and 36B depict diagrams illustrating an example of a structure of a semiconductor apparatus in a seventh embodiment of the present technology. In FIGS. 36A and 36B, FIG. 36A illustrates a sectional view, and FIG. 36B illustrates a back view.

While the wiring 541 is provided in the upside of the cavity portion 568 in the above sixth embodiment, a silicide 641 is provided on the silicon substrate 610 to stop the etching at the silicide 641 in this seventh embodiment. The silicide 641 includes, for example, TiSi, CoSi, or the like as a material.

Other structures are similar to those of the sixth embodiment. Also, the manufacturing method is similar to that of the above sixteenth embodiment, and a detailed description will be omitted.

As described above, in the seventh embodiment of the present technology, copper wiring is not used as an etch stop unlike in the above sixth embodiment, making it possible to improve a degree of freedom in wiring layout.

It should be noted that the above embodiments illustrate examples for realizing the present technology, and matters in the embodiments and matters defining the invention in the claims are in correspondence with each other. Similarly, the matters defining the invention in the claims and matters in the embodiments of the present technology having the same names are in correspondence with each other. It should be noted, however, that the present technology is not limited to the embodiments and can be realized by making various modifications to the embodiments without departing from the gist thereof.

Also, processing steps described in the above embodiments may be regarded as a method having a series of these steps, a program for causing a computer to perform the series of these steps, or a recording medium storing the program. For example, a CD (Compact Disc), an MD (MiniDisc), a DVD (Digital Versatile Disc), a memory card, a Blu-ray (registered trademark) Disc, or the like can be used as this recording medium.

It should be noted that the advantageous effects mentioned in the present specification are merely illustrative and not restrictive, and there may be other advantageous effects.

It should be noted that the present technology can also have the following configurations.

(1) A semiconductor apparatus including:

a via that vertically penetrates a given layer;

an upper surface side material and a lower surface side material of the layer; and a conductor that is in contact with the upper surface side material and the lower surface side material of the layer and that forms, between the conductor and an inside of the via, a cavity portion that vertically penetrates the layer.

(2) The semiconductor apparatus according to (1), in which at least either the upper surface side material or the lower surface side material of the layer includes a conductive material, and at least part of the conductive material includes an opening portion for the cavity portion.

(3) The semiconductor apparatus according to (1) or (2), in which the layer is a semiconductor substrate.

(4) The semiconductor apparatus according to (1) or (2), in which the layer is an insulating film.

(5) The semiconductor apparatus according to any one of (1) to (4), further including:

an insulating side wall formed inside the via.

(6) The semiconductor apparatus according to any one of (1) to (5), in which the conductor includes an insulating material thereinside.

(7) The semiconductor apparatus according to any one of (1) to (6), in which the conductor forms wiring.

(8) The semiconductor apparatus according to any one of (1) to (7), further including:

a surrounding trench that vertically penetrates the layer at a circumference of the via.

(9) An imaging apparatus having a stacked structure that includes multiple layers, the imaging apparatus including:

a via that vertically penetrates a given layer of the multiple layers;

an upper surface side material and a lower surface side material of the layer; and a conductor that is in contact with the upper surface side material and the lower surface side material of the layer and that forms, between the conductor and an inside of the via, a cavity portion that vertically penetrates the layer.

(10) The imaging apparatus according to (9), in which at least either the upper surface side material or the lower surface side material of the layer includes a conductive material, and at least part of the conductive material includes an opening portion for the cavity portion.

(11) The imaging apparatus according to (10), in which the conductive material is arranged on a surface opposed to an incident light side.

(12) The imaging apparatus according to (10), in which the conductive material is arranged on the same surface as an incident light side.

(13) A semiconductor apparatus manufacturing method including:

a step of forming a via that vertically penetrates a given layer;

a step of forming, inside the via, an etching target material having an etching rate different from that of the layer;

a step of forming a conductor inside the etching target material; and a step of etching the etching target material with the conductor in contact with an upper surface side material and a lower surface side material of the layer.

(14) The semiconductor apparatus manufacturing method according to (13), in which at least either the upper surface side material or the lower surface side material of the layer includes a conductive material, and the semiconductor apparatus manufacturing method further includes a step of shaping the conductive material such that the etching target material is exposed at least at part of the conductive material.

REFERENCE SIGNS LIST

110, 210, 510, 610, 710, 711: Silicon substrate
115, 515, 615: STI (Shallow Trench Isolation)

120, 520, 620: Transistor
130, 202, 203, 310 to 312, 410, 411, 530, 630: Interlayer insulating film
140, 240, 340, 440, 540, 541, 640, 740: Wiring
150, 250, 550, 650, 750: Insulating film
160, 260, 360, 460, 560, 561, 760: Via
163, 165, 263, 563, 763: Side wall
167, 267, 367, 467, 568, 767: Cavity portion
170, 270, 370, 471, 472, 570, 670, 770: Wiring
180, 280, 580, 780: Insulating layer
190, 590, 690, 790: Bump
221, 721: Pixel transistor
230, 730: Color filter
265, 365, 463: Resin
361: Wiring trench
569: Insulating film
581: Photoresist
641: Silicide
702, 703: Insulating film
713: Bumps

The invention claimed is:

1. A semiconductor apparatus, comprising:
a substrate layer;
a via that vertically penetrates the substrate layer;
an upper surface side material on an upper surface side of the substrate layer;
a lower surface side material on a lower surface side of the substrate layer;
a conductor that is in contact with the upper surface side material and the lower surface side material;
an insulating side wall inside the via;
an insulating layer, wherein
the conductor is inside the via, and
the insulating layer is inside the conductor within the via; and
a cavity portion that vertically penetrates the substrate layer, wherein
the cavity portion is between the conductor and the insulating side wall of the via.

2. The semiconductor apparatus according to claim 1, wherein
at least one of the upper surface side material or the lower surface side material includes a conductive material, and
at least a part of the conductive material includes an opening portion for the cavity portion.

3. The semiconductor apparatus according to claim 1, wherein
the substrate layer is a semiconductor substrate.

4. The semiconductor apparatus according to claim 1, further comprising
an insulating film between the lower surface side material and the substrate layer.

5. The semiconductor apparatus according to claim 1, further comprising:
a surrounding trench that vertically penetrates the substrate layer at a circumference of the via.

* * * * *